(12) United States Patent
Bisges et al.

(10) Patent No.: US 12,446,252 B2
(45) Date of Patent: Oct. 14, 2025

(54) TRANSISTORS INCLUDING SEMICONDUCTOR SURFACE MODIFICATION AND RELATED FABRICATION METHODS

(71) Applicant: MACOM Technology Solutions Holdings, Inc., Lowell, MA (US)

(72) Inventors: Joshua Bisges, Wake Forest, NC (US); Kyle Bothe, Cary, NC (US); Matthew King, Wake Forest, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 380 days.

(21) Appl. No.: 17/325,488

(22) Filed: May 20, 2021

(65) Prior Publication Data

US 2022/0376104 A1    Nov. 24, 2022

(51) Int. Cl.
*H10D 30/47*     (2025.01)
*H01L 21/263*    (2006.01)
(Continued)

(52) U.S. Cl.
CPC ....... *H10D 30/4755* (2025.01); *H01L 21/263* (2013.01); *H10D 62/221* (2025.01); *H10D 62/824* (2025.01); *H10D 64/111* (2025.01)

(58) Field of Classification Search
CPC ............... H01L 29/7787; H01L 21/263; H01L 29/1029; H01L 29/205; H01L 29/402; H01L 29/41758; H01L 2224/32245; H01L 2224/48091; H01L 2224/48105; H01L 2224/48195; H01L 23/3171;
(Continued)

(56) References Cited

U.S. PATENT DOCUMENTS

| 4,946,547 A | 8/1990 | Palmour et al. |
| 5,192,987 A | 3/1993 | Khan et al. |

(Continued)

FOREIGN PATENT DOCUMENTS

| CN | 104022151 A | 9/2014 | |
| CN | 104022151 B * | 3/2018 | ......... H01L 29/7786 |

(Continued)

OTHER PUBLICATIONS

Hoshi et al. "Influence of NH3-plasma pretreatment before Si3N4 passivation film deposition on current collapse in AlGaN/GaN-HEMTs" IEICE Transactions on Electronics E89-C(7):1052-1056 (Jul. 2006).

(Continued)

*Primary Examiner* — Duy T Nguyen
*Assistant Examiner* — Pratiksha Jayant Lohakare
(74) *Attorney, Agent, or Firm* — Myers Bigel, P.A.

(57) ABSTRACT

A transistor device includes a semiconductor structure, source and drain contacts on the semiconductor structure, a gate on the semiconductor structure between the source and drain contacts, and a surface passivation layer on the semiconductor structure between the gate and the source or drain contact. The surface passivation layer includes an opening therein that exposes a first region of the semiconductor structure for processing the first region differently than a second region of the semiconductor structure adjacent the gate. Related devices and fabrication methods are also discussed.

34 Claims, 13 Drawing Sheets

(51) Int. Cl.
  *H10D 62/17* (2025.01)
  *H10D 62/824* (2025.01)
  *H10D 64/00* (2025.01)

(58) Field of Classification Search
  CPC ..... H01L 23/3192; H01L 24/00; H01L 29/34; H01L 29/66462; H01L 29/7786; H01L 29/42316; H01L 29/2003
  USPC .......................................................... 257/76
  See application file for complete search history.

(56) References Cited

U.S. PATENT DOCUMENTS

| | | | |
|---|---|---|---|
| 5,200,022 | A | 4/1993 | Kong et al. |
| 5,210,051 | A | 5/1993 | Carter |
| 5,296,395 | A | 3/1994 | Khan et al. |
| RE34,861 | E | 2/1995 | Davis et al. |
| 5,393,993 | A | 2/1995 | Edmond et al. |
| 5,523,589 | A | 6/1996 | Edmond et al. |
| 6,218,680 | B1 | 4/2001 | Carter et al. |
| 6,316,793 | B1 | 11/2001 | Sheppard et al. |
| 6,548,333 | B2 | 4/2003 | Smith |
| 6,586,781 | B2 | 7/2003 | Wu et al. |
| 7,030,428 | B2 | 4/2006 | Saxler |
| 7,045,404 | B2 | 5/2006 | Sheppard et al. |
| 7,259,402 | B2 | 8/2007 | Edmond et al. |
| 7,291,529 | B2 | 11/2007 | Slater et al. |
| 7,419,892 | B2 * | 9/2008 | Sheppard .......... H01L 21/26553 257/E29.104 |
| 7,544,963 | B2 | 6/2009 | Saxler |
| 7,548,112 | B2 | 6/2009 | Sheppard |
| 7,592,211 | B2 | 9/2009 | Sheppard et al. |
| 7,615,774 | B2 | 11/2009 | Saxler |
| 7,709,269 | B2 | 5/2010 | Smith et al. |
| 7,875,537 | B2 * | 1/2011 | Suvorov .......... H01L 29/66462 438/522 |
| 7,932,111 | B2 | 4/2011 | Edmond |
| 8,049,252 | B2 | 11/2011 | Smith et al. |
| 8,120,064 | B2 | 2/2012 | Parikh et al. |
| 8,513,686 | B2 | 8/2013 | Edmond |
| 8,563,372 | B2 | 10/2013 | Hagleitner et al. |
| 8,823,057 | B2 * | 9/2014 | Sheppard .............. H01L 29/802 257/192 |
| 9,214,352 | B2 | 12/2015 | Hagleitner et al. |
| 9,425,268 | B2 * | 8/2016 | Minoura .............. H10D 64/035 |
| 9,780,190 | B2 * | 10/2017 | Ye ........................ H10D 64/691 |
| 10,008,591 | B2 * | 6/2018 | Nishimori .............. H01L 21/764 |
| 10,692,998 | B2 * | 6/2020 | Fayed ................ H01L 29/7786 |
| 10,727,288 | B2 * | 7/2020 | Tanaka ................... H10D 99/00 |
| 10,971,612 | B2 | 4/2021 | Bothe et al. |
| 11,732,297 | B2 * | 8/2023 | Rothberg ............. G01N 27/414 205/775 |
| 11,874,250 | B2 * | 1/2024 | Rothberg ............ G01N 27/4145 |
| 12,199,169 | B2 * | 1/2025 | Cheng ..................... B82Y 10/00 |
| 2003/0020092 | A1 | 1/2003 | Parikh et al. |
| 2004/0144991 | A1 * | 7/2004 | Kikkawa ............ H01L 29/7787 257/E29.253 |
| 2005/0035455 | A1 * | 2/2005 | Hu ...................... H01L 29/6656 257/E21.576 |
| 2005/0258451 | A1 | 11/2005 | Saxler et al. |
| 2007/0194354 | A1 * | 8/2007 | Wu ....................... H01L 29/402 257/E29.093 |
| 2007/0235775 | A1 * | 10/2007 | Wu .................... H10D 30/4755 257/E29.127 |
| 2009/0283756 | A1 | 11/2009 | Hellings et al. |
| 2010/0295100 | A1 | 11/2010 | Huang et al. |
| 2011/0057232 | A1 * | 3/2011 | Sheppard ............ H01L 29/0843 257/E21.403 |
| 2012/0217544 | A1 * | 8/2012 | Ohki .................... H10D 30/015 257/E29.246 |
| 2013/0228789 | A1 * | 9/2013 | Yamamura ............ H01L 29/772 257/195 |
| 2014/0284613 | A1 | 9/2014 | Kuraguchi et al. |
| 2015/0035010 | A1 | 2/2015 | Takeuchi et al. |
| 2016/0282289 | A1 | 9/2016 | Tanaka |
| 2017/0117132 | A1 * | 4/2017 | Koyama .......... H01L 21/02274 |
| 2017/0330940 | A1 | 11/2017 | Lee |
| 2017/0352754 | A1 * | 12/2017 | Beach ................ H01L 29/7787 |
| 2019/0385846 | A1 | 12/2019 | Fukuhara et al. |
| 2020/0365699 | A1 | 11/2020 | Chang et al. |
| 2020/0395475 | A1 * | 12/2020 | Bothe ................... H03F 1/0205 |
| 2021/0111254 | A1 | 4/2021 | Jones et al. |
| 2021/0118871 | A1 | 4/2021 | Piedra et al. |
| 2021/0257486 | A1 | 8/2021 | Wong |
| 2021/0384303 | A1 | 12/2021 | Zhang et al. |
| 2022/0130985 | A1 * | 4/2022 | Bothe ................... H01L 29/402 |
| 2022/0223694 | A1 | 7/2022 | Kantarovsky et al. |
| 2022/0302291 | A1 * | 9/2022 | Guo ....................... H01L 29/778 |

FOREIGN PATENT DOCUMENTS

| | | |
|---|---|---|
| EP | 2852980 A1 | 4/2015 |
| JP | 2008112949 A | 5/2008 |
| JP | 2011077123 A | 4/2011 |
| JP | 2011238701 A | 11/2011 |
| JP | 2012175018 A | 9/2012 |
| JP | 2014187084 A | 10/2014 |
| JP | 2017195299 A | 10/2017 |
| JP | 2018506849 A | 3/2018 |
| WO | 2010122628 A1 | 10/2010 |

OTHER PUBLICATIONS

Notification of Transmittal of the International Search Report and the Written Opinion of the International Searching Authority, or the Declaration, in corresponding PCT Application No. PCT/US2022/029734 (May 18, 2022).

Song et al. "Normally-off AlGaN/GaN Low-Density-Drain HEMTs (LDD-HEMT) with Enhanced Breakdown Voltage and Suppressed Current Collapse" Proceedings of the 19th International Symposium on Power Semiconductor Devices and IC's 28(3):189-191 (Mar. 2007).

Japanese Office Action corresponding to Japanese Application No. 2023-571537 (Dec. 13, 2024).

* cited by examiner

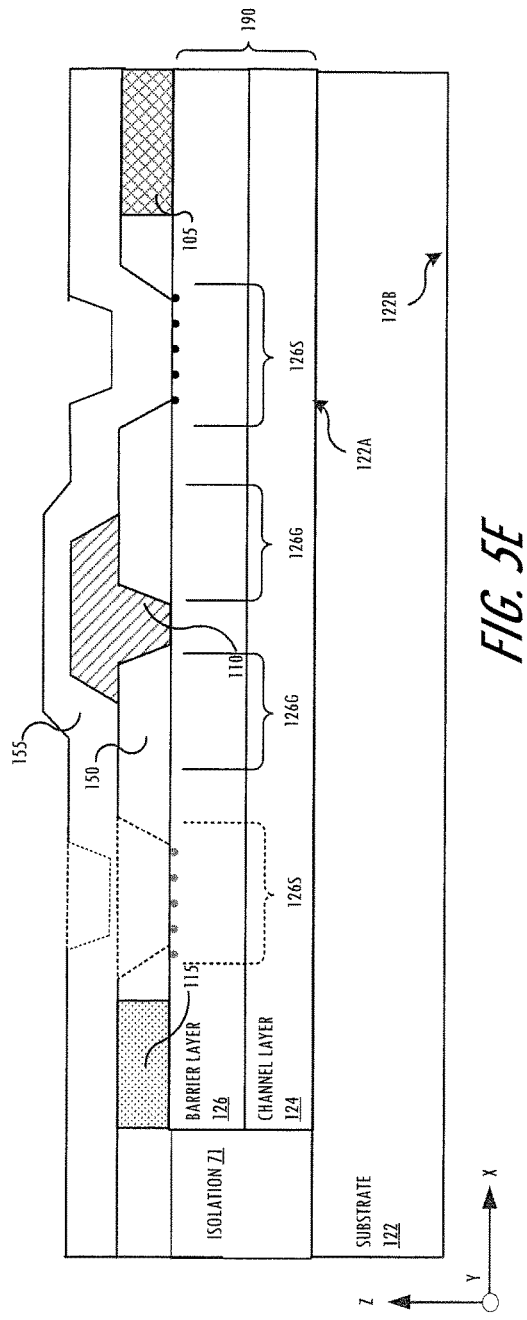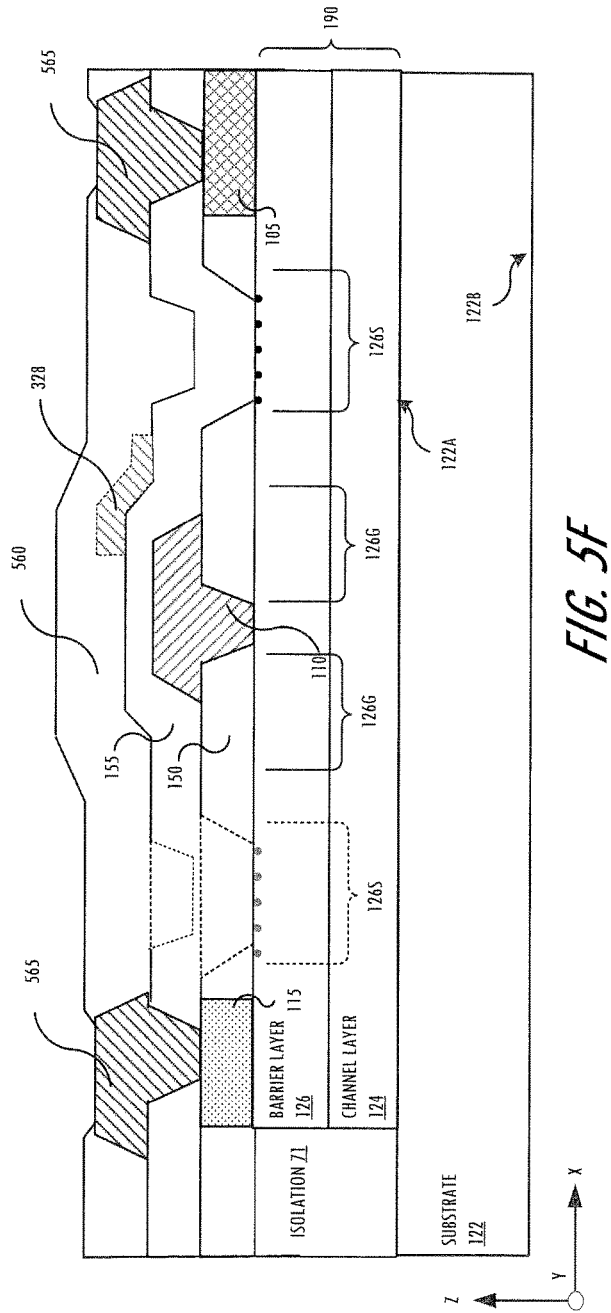

TRANSISTORS INCLUDING SEMICONDUCTOR SURFACE MODIFICATION AND RELATED FABRICATION METHODS

FIELD

The present invention relates to semiconductor devices, and more particularly, to transistor devices and related fabrication methods.

BACKGROUND

Materials such as silicon (Si) and gallium arsenide (GaAs) have found wide application in semiconductor devices for low power and, in the case of Si, low frequency applications. However, these materials may not be well-suited for high power and/or high frequency applications, for example, due to their relatively small bandgaps (1.12 eV for Si and 1.42 for GaAs at room temperature) and relatively small breakdown voltages.

For high power, high temperature and/or high frequency applications and devices, wide bandgap semiconductor materials may be used, such as silicon carbide (SiC) (e.g., with a bandgap of about 3.2 eV for 4H—SiC at room temperature) and the Group III nitrides (e.g., with a bandgap of about 3.36 eV for gallium nitride (GaN) at room temperature). These materials may have higher electric field breakdown strengths and higher electron saturation velocities as compared to GaAs and Si.

A device of particular interest for high power and/or high frequency applications is the high electron mobility transistor (HEMT), which is also known as a modulation doped field effect transistor (MODFET). In a HEMT device, a two-dimensional electron gas (2DEG) may be formed at the heterojunction of two semiconductor materials with different bandgap energies. The smaller bandgap material may have a higher electron affinity than the wider bandgap material. The 2DEG is an accumulation layer in the undoped smaller bandgap material and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance and may provide performance advantages over metal-oxide-semiconductor field effect transistors (MOSFETS) for high-frequency applications HEMTs fabricated in Group III-nitride materials (such as the gallium nitride/aluminum gallium nitride (GaN/AlGaN) material system) can generate large amounts of radio frequency (RF) power due to a combination of material characteristics, such as relatively high breakdown fields, relatively wide bandgaps, relatively large conduction band offset, and/or relatively high saturated electron drift velocity. Thus, HEMT devices may be used in RF power amplifiers. Group III-nitride-based HEMTs also offer high charge density, high electron mobility and improved thermal conductivity, particularly on SiC substrates.

Electron trapping and resulting differences between DC and RF characteristics can be a limiting factor in the performance of these devices. Silicon nitride (SiN) passivation has been employed to alleviate this trapping problem resulting in high performance devices with power densities over 10 W/mm at 10 GHz. For example, U.S. Pat. No. 6,586,781 to Wu et al. describes methods and structures for reducing trapping effects in GaN-based transistors. However, due to the high electric fields existing in these structures, charge trapping can still be a concern.

SUMMARY

According to some embodiments of the present invention, a transistor device includes a semiconductor structure, source and drain contacts on the semiconductor structure, a gate on the semiconductor structure between the source and drain contacts, and a surface passivation layer on the semiconductor structure between the gate and the source or drain contact. The surface passivation layer includes an opening therein that exposes a first region of the semiconductor structure for processing the first region.

In some embodiments, the semiconductor structure may include a channel layer and a barrier layer defining a heterojunction therebetween. The first region may have a higher conductivity than a second region of the semiconductor structure adjacent the gate. In some embodiments, the first region may have lower sheet resistance than the second region.

In some embodiments, the first region may have a different surface characteristic than the second region.

In some embodiments, the first region may include modified interface states. The second region may be free of the modified interface states or may include differently modified interface states.

In some embodiments, the opening may be laterally separated from the gate by the second region. In some embodiments, the gate may include a sidelobe portion laterally extending along the surface passivation layer toward the source or drain contact, and the sidelobe portion may extend over the second region. In some embodiments, the opening may be laterally spaced apart from the gate along a surface of the semiconductor structure by about 10 nanometers (nm) to about 500 nm.

In some embodiments, the surface passivation layer may be a first passivation layer. A second passivation layer may be provided on the first passivation layer and extending into the opening to contact the first region. An interface between the first region and the second passivation layer may include the modified interface states, which may be different than an interface between the second region and the first passivation layer.

In some embodiments, the modified interface states may be defined by formation of the second passivation layer.

In some embodiments, a field plate may be provided on the second passivation layer and between the gate and the drain contact. The opening may be laterally spaced apart from at least a portion of the field plate.

In some embodiments, the field plate may at least partially overlap with the opening, with the second passivation layer therebetween.

In some embodiments, the surface-treated region may be defined by ion bombardment, plasma nitridation, plasma oxidation, hydrogen plasma treatment, and/or annealing in a gas environment.

According to some embodiments, a transistor device includes a semiconductor structure comprising a channel layer and a barrier layer defining a heterojunction therebetween, source and drain contacts on the semiconductor structure, and a gate on the semiconductor structure between the source and drain contacts. The semiconductor structure includes a first region between the gate and the source or drain contact, and a second region adjacent the gate, where the first region has a higher conductivity than the second region.

In some embodiments, the first region may have lower sheet resistance than the second region.

In some embodiments, the semiconductor structure comprising the first and second regions may have a conductivity that varies in a non-uniform manner between the gate and the source or drain contact.

In some embodiments, the first region may have a different surface characteristic than the second region.

In some embodiments, the first region may include modified interface states. The second region may be free of the modified interface states or may include differently modified interface states.

In some embodiments, a surface passivation layer may be provided on the surface of the semiconductor structure between the gate and the source or drain contact. The surface passivation layer may include an opening therein that exposes the first region.

In some embodiments, the opening may be laterally separated from the gate by the second region. In some embodiments, the gate may include a sidelobe portion laterally extending along the surface passivation layer toward the source or drain contact, and the sidelobe portion may extend over the second region. In some embodiments, the opening may be laterally spaced apart from the gate along the surface of the semiconductor structure by about 10 nanometers (nm) to about 500 nm.

In some embodiments, the surface passivation layer may be a first passivation layer. A second passivation layer may be provided on the first passivation layer and extending into the opening to contact the first region. An interface between the first region and the second passivation layer may include the modified interface states, which may be different than an interface between the second region and the first passivation layer.

According to some embodiments, a transistor device includes a semiconductor structure comprising a channel layer and a barrier layer defining a heterojunction therebetween, source and drain contacts on the semiconductor structure, a gate on a surface of the semiconductor structure between the source and drain contacts, and one or more passivation layers on the surface of the semiconductor structure between the gate and the source or drain contact. A conductivity of the semiconductor structure varies in a non-uniform manner in a direction along an interface with the one or more passivation layers thereon.

In some embodiments, the semiconductor structure comprises a first region between the gate and the source or drain contact, and a second region adjacent the gate, where the first region has a higher conductivity than the second region. In some embodiments, the first region may have lower sheet resistance than the second region.

In some embodiments, the first region may include a different surface characteristic than the second region. In some embodiments, the first region may include modified interface states, and the second region may be free of the modified interface states or may include differently modified interface states.

In some embodiments, the one or more passivation layers may include a first passivation layer on the second region of the semiconductor structure adjacent the gate. The first passivation layer may include an opening therein that exposes the first region, where the opening may be laterally separated from the gate by the second region.

In some embodiments, the one or more passivation layers may further include a second passivation layer on the first passivation layer and extending into the opening to contact the first region. The interface may include a first interface between the first region and the second passivation layer, and a second interface between the second region and the first passivation layer. The first interface may include the modified interface states that are different than the second interface.

In some embodiments, a field plate may be provided on the second passivation layer between the gate and the drain contact, and the opening may be laterally spaced apart from at least a portion of the field plate.

According to some embodiments, a method of fabricating a transistor device includes forming a surface passivation layer on a semiconductor structure, forming source and drain contacts and a gate on the semiconductor structure, where the gate is between the source and drain contacts, forming an opening in the surface passivation layer that exposes a first region of the semiconductor structure between the gate and the source or drain contact, and processing the first region of the semiconductor structure that is exposed by the opening differently than a second region of the semiconductor structure that is adjacent the gate.

In some embodiments, the semiconductor structure may include a channel layer and a barrier layer defining a heterojunction therebetween. The first region may have a higher conductivity than the second region of the semiconductor structure responsive to the processing.

In some embodiments, the first region may have lower sheet resistance than the second region responsive to the processing.

In some embodiments, the first region may include a different surface characteristic than the second region responsive to the processing.

In some embodiments, the processing may include performing a surface treatment of the first region exposed by the opening to modify interface states thereof, where the second region may be substantially unaffected by the surface treatment.

In some embodiments, the surface treatment may include ion bombardment, plasma nitridation, plasma oxidation, hydrogen plasma treatment, and/or annealing in a gas environment.

In some embodiments, the surface treatment may include wet etching in an acidic chemical solution, wet etching in a basic chemical solution, and/or treatment in a neutral chemical solution.

In some embodiments, the surface passivation layer may be a first passivation layer, and a second passivation layer may be formed on the first passivation layer and extending into the opening to contact the first region. An interface between the first region and the second passivation layer may include the modified interface states, which may be different than an interface between the second region and the first passivation layer.

In some embodiments, forming the second passivation layer may preserve the modified interface states of the first region.

In some embodiments, the surface passivation layer may be a first passivation layer, and a second passivation layer may be formed on the first passivation layer and extending into the opening to contact the first region. Forming the second passivation layer may modify interface states of the first region.

In some embodiments, forming the opening in the surface passivation layer may modify interface states of the first region.

In some embodiments, the opening may be laterally separated from the gate by the second region.

In some embodiments, the gate may include a sidelobe portion laterally extending along the surface passivation layer toward the source or drain contact, and the sidelobe portion may extend over the second region.

In some embodiments, the opening may be laterally spaced apart from the gate along the surface of the semiconductor structure by about 10 nanometers (nm) to about 500 nm.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 5A, 5B, 5C, 5D, 5E, and 5F are schematic cross-sectional views illustrating example intermediate fabrication steps in methods for fabricating transistor structures according to some embodiments of the present invention.

DETAILED DESCRIPTION

Some embodiments of the present invention may arise from realization that improved device performance (including but not limited to RF and DC performance) in transistor devices can be achieved by altering or modifying interface states between a semiconductor structure and the passivation layer, which may increase the surface potential or otherwise increase conductivity in the channel region. For example, the density of interface states along the interface between the semiconductor structure and the passivation layer may reduce surface electron mobility and introduce carrier traps (also referred to herein as charge trapping), which in turn can reduce the desired performance characteristics of devices. High electron mobility transistor (HEMT) devices with improved device performance (e.g., higher saturation power, lower charge trapping) can be achieved by modifying or altering interface states between the passivation layer and the underlying semiconductor layer (e.g., AlGaN/SiN interface states) so as to increase the conductivity of the semiconductor layer in the channel region. However, the presence of such altered interface states close to the gate may result in unacceptably high gate leakage current.

Embodiments of the present invention are directed to transistor devices, such as HEMT devices, with improved performance. The HEMT devices include high conductivity, low sheet resistance regions in the active area or active region, so as to provide local charge control in portions of the channel region between the gate and the source and/or drain regions, also referred to herein as source and/or drain access regions. More particularly, some embodiments of the present invention provide devices and fabrication methods that include localized surface modification in the active area so as to provide a non-uniform variation in conductivity in the conduction channel along a lateral direction between the gate and the drain (or source). For example, one or more surface treatments may be provided to a surface of a barrier layer in the source and/or drain access regions of a HEMT device to modify interface states between the barrier layer and a passivation layer in those regions. Device performance may thus be increased while maintaining low leakage levels, in some instances without additional process steps for ease of integration with conventional fabrication processes.

Figure 1A:
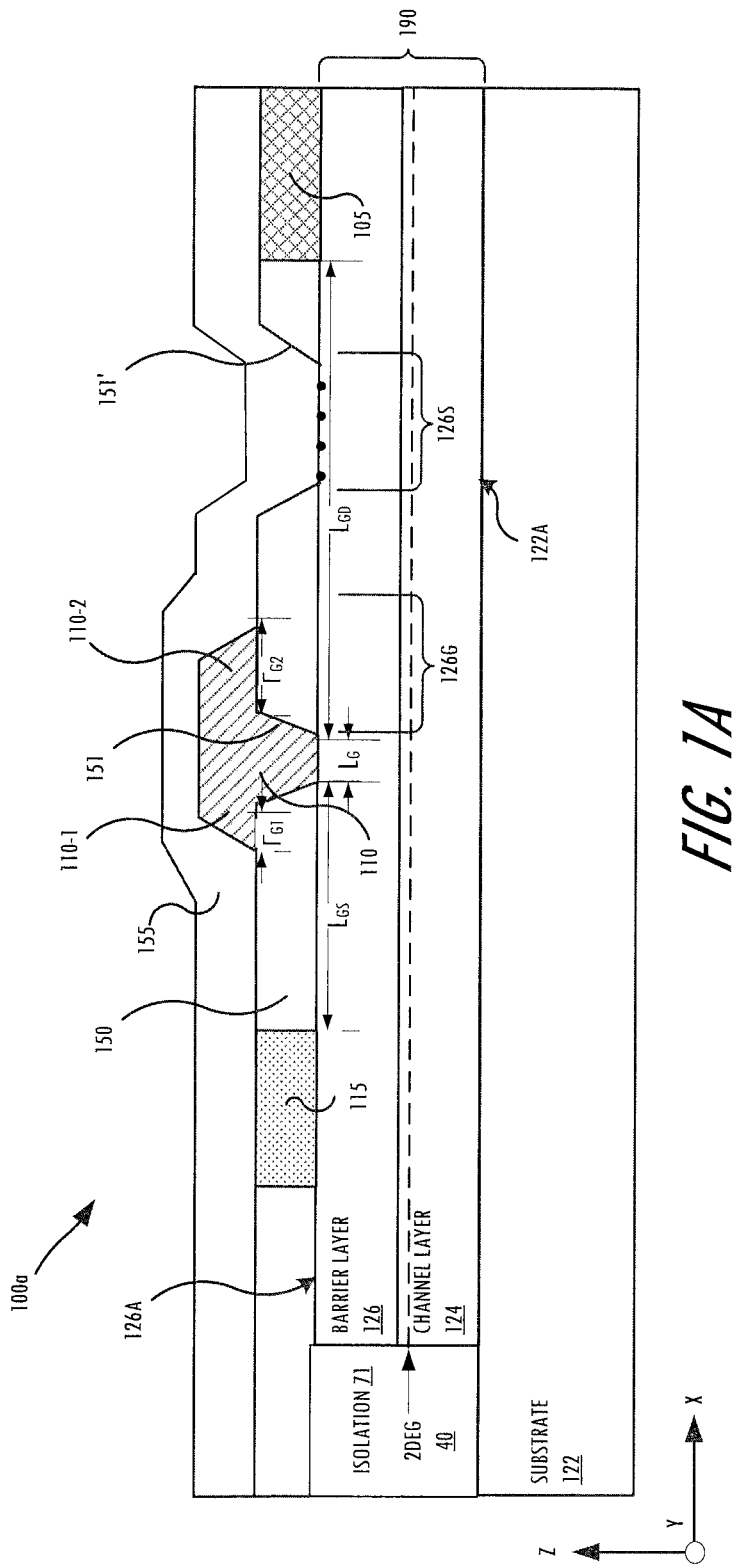
FIGS. 1A, 1B, and 1C are schematic cross-sectional views of transistor devices including higher-conductivity source and/or drain access regions according to some embodiments of the present invention.
Figure 1B:
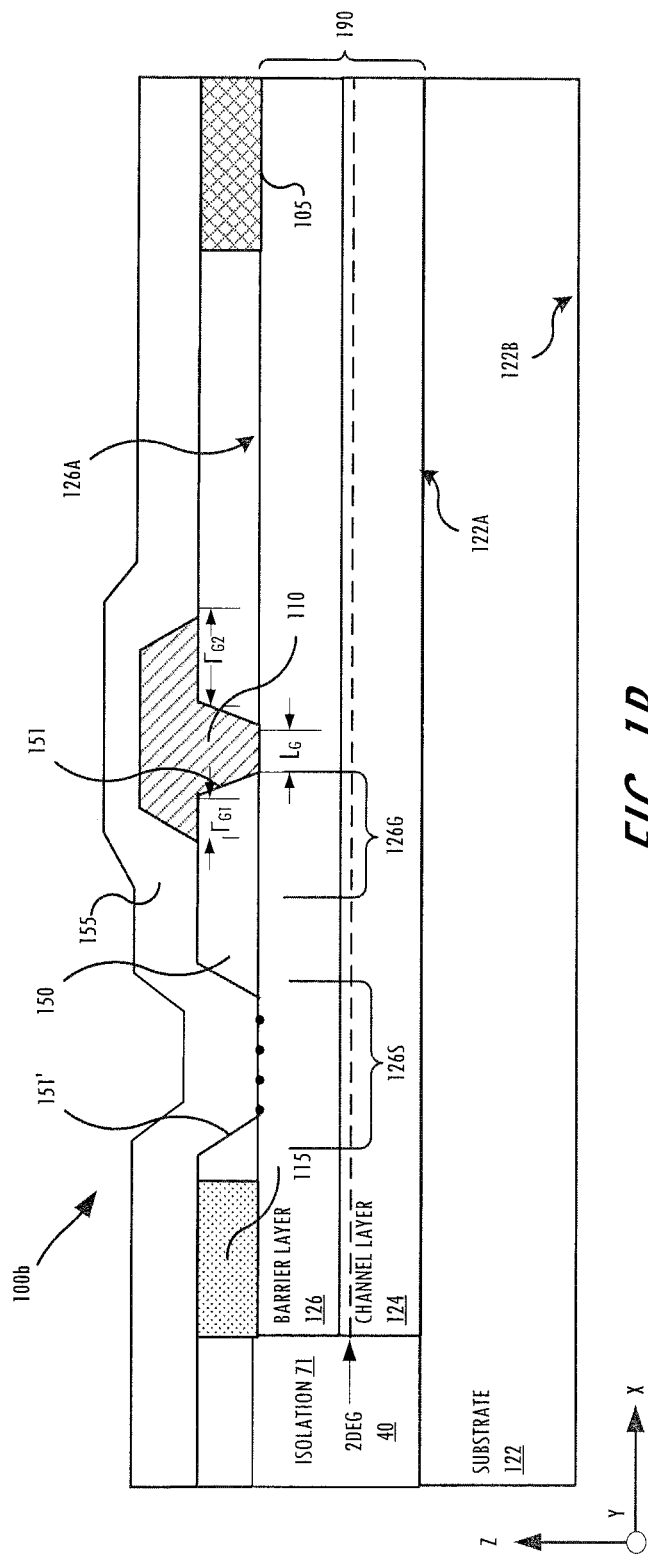
Figure 1C:
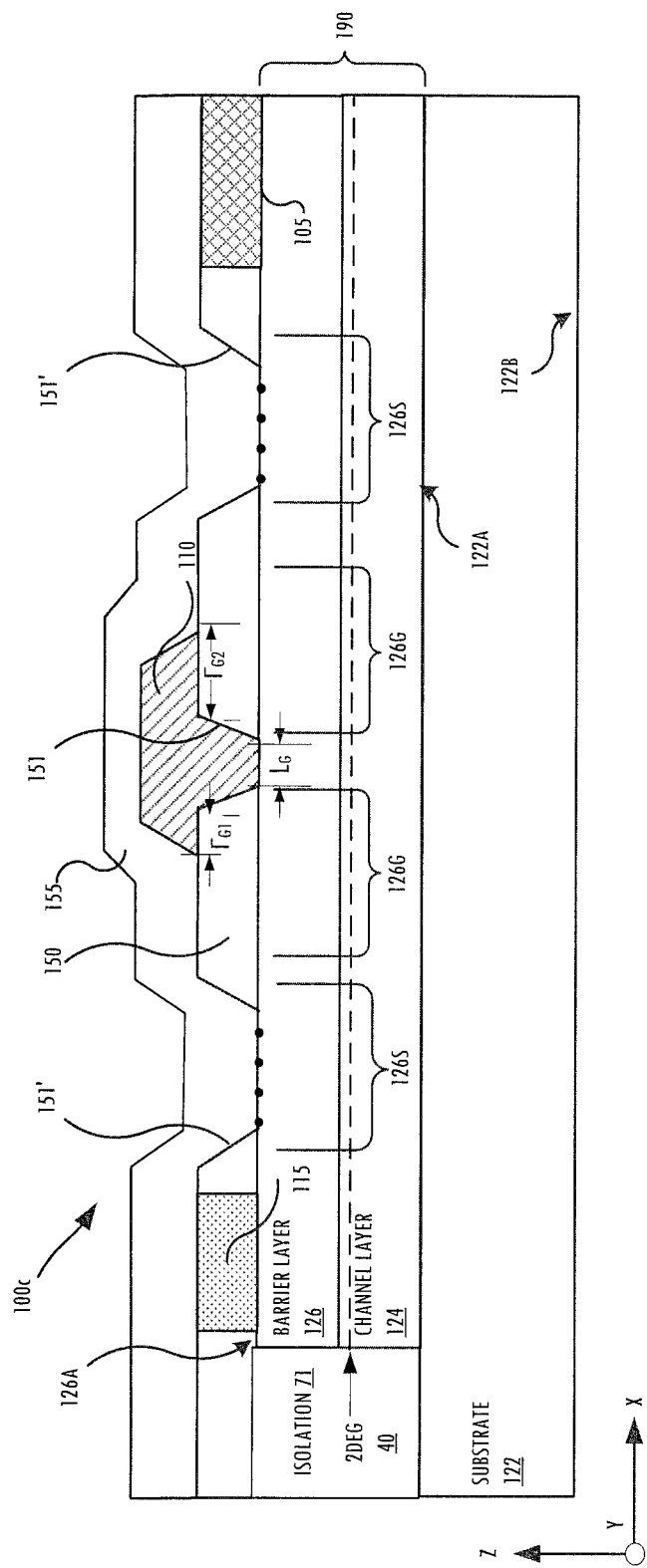

FIGS. 1A, 1B, and 1C are schematic cross-sectional views of transistor devices according to some embodiments of the present invention, illustrated by way of example with reference to unit cell transistor structures 100a, 100b, 100c (also referred to herein as a transistor structure or transistor cell) of a transistor device, such as a HEMT. In particular, FIGS. 1A to 1C illustrate examples of HEMT devices including high-conductivity regions or surfaces as described herein.

As shown in FIGS. 1A to 1C, transistor structures 100a, 100b, 100c are formed on a substrate 122 such as, for example, a silicon carbide substrate. Hundreds or thousands of unit cell transistor structures 100a, 100b, 100c may be formed on the semiconductor substrate 122, and may be electrically connected (e.g., in parallel) to provide the HEMT device. The substrate 122 may be a semi-insulating silicon carbide substrate that may be, for example, the 4H polytype of silicon carbide. Other silicon carbide candidate polytypes may include the 3C, 6H, and 15R polytypes. Although silicon carbide may be used as a substrate material, embodiments of the present disclosure may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 122 may be a silicon carbide wafer, and the HEMT device may be formed, at least in part, via wafer-level processing, and the wafer may then be diced or otherwise singulated to provide a die including a plurality of the unit cell transistor structures 100a, 100b, 100c.

The transistor structures 100a, 100b, 100c include a channel layer 124 on the substrate 122, and a barrier layer 126 on the channel layer 124 opposite the substrate 122. Source and drain electrodes (also referred to herein as source and drain contacts) 115 and 105 are formed on an upper surface of the barrier layer 126 and are laterally (e.g., along the X-direction) spaced apart from each other. The source contact 115 and the drain contact 105 may form an ohmic contact to the barrier layer 126.

One or more insulator layers (for example, one or more passivation layers) 150, 155 are formed on the barrier layer, and a gate contact (or simply "gate") 110 is formed on a surface of the barrier layer 126 between the source and drain electrodes 115 and 105. Depending on configuration, one or more of the insulator layers 150, 155 may be formed before and/or after formation of the gate 110.

The channel layer 124 may have a bandgap that is less than the bandgap of the barrier layer 126 and the channel layer 124 may also have a larger electron affinity than the barrier layer 126. The channel layer 124 and barrier layer 126 may together define a semiconductor structure 190. In the illustrated examples, the semiconductor structure 190 may be a semiconductor layer structure including one or more layers formed by epitaxial growth, and thus include one or more epitaxial layers 124, 126. Techniques for epitaxial growth of Group III nitrides have been described in, for example, U.S. Pat. Nos. 5,210,051, 5,393,993, and 5,523,589, the disclosures of which are also incorporated by reference herein in their entireties.

In the illustrated HEMT devices, the semiconductor layer structure 190 may be Group-III nitride based, although other material systems can also be used. Group III nitrides may refer to semiconductor compounds formed between nitrogen and the elements in the Group III of the periodic table, such as aluminum (Al), gallium (Ga), and/or indium (In) to form binary (e.g., GaN), ternary (e.g., AlGaN, AlInN), and quaternary (e.g., AlInGaN) compounds. Accordingly, formulas such as $Al_xGa_{1-x}N$, where $0 \leq x \leq 1$, may be used to describe these compounds. One or both of the channel layer 124 and the barrier layer 126 may include sub-layers including doped or undoped (i.e., "unintentionally doped") layers of Group III-nitride materials, including material compositions which may be stepwise or continuously graded. For example, the channel layer 124 may be a multi-layer structure, such as a superlattice or combinations of GaN, AlGaN or the like. The channel layer 124 may be under compressive strain in some embodiments. In some embodiments, the barrier layer 126 may be AlN, AlInN, AlGaN, AlInGaN, AlScN, alloys thereof, or any combinations of layers thereof. The barrier layer 126 may comprise a single layer or may be a multi-layer structure. In particular embodiments of the present disclosure, the barrier layer 126 may be thick enough and may have a high enough aluminum (Al) composition and doping to induce a significant carrier concentration at the interface between the channel layer 124 and the barrier layer 126 through polarization effects when the barrier layer 126 is buried under ohmic contact metal.

While semiconductor structure 190 is shown with reference to one or more epitaxial layers 124, 126 for purposes of illustration, the semiconductor structure 190 may include additional layers/structures/elements such as isolation layer (s) 71, buffer and/or nucleation layer(s) on or between substrate 122 and the one or more epitaxial layers 124, and/or a cap layer on an upper surface 126A of the epitaxial layer 126. For example, an AlN buffer layer may be formed on the upper surface 122A of the substrate 122 to provide an appropriate crystal structure transition between the silicon carbide substrate 122 and the remainder of the layers of the semiconductor structure 190. Additionally, strain balancing transition layer(s) may also and/or alternatively be provided as described, for example, in commonly assigned U.S. Pat. No. 7,030,428, the disclosure of which is incorporated herein by reference as if set forth fully herein. The optional buffer/nucleation/transition layers, as well as the channel layer 124 and/or the barrier layer 126, may be deposited by metal-organic chemical vapor deposition (MOCVD), molecular beam epitaxy (MBE), and/or hydride vapor phase epitaxy (HVPE).

The material of the gate 110 may be chosen based on the composition of the semiconductor structure 190, and may, in some embodiments, be a Schottky contact. Some materials capable of making a Schottky contact to a Group III nitride based semiconductor material that may be used as the gate 110 may include, for example, nickel (Ni), platinum (Pt), nickel silicide ($NiSi_x$), copper (Cu), palladium (Pd), chromium (Cr), tungsten (W) and/or tungsten silicon nitride (WSiN).

The source contact 115 and/or the drain contact 105 may include a metal that can form an ohmic contact to a Group III nitride based semiconductor material. Suitable metals may include refractory metals, such as Ti, W, titanium tungsten (TiW), silicon (Si), titanium tungsten nitride (TiWN), tungsten silicide (WSi), rhenium (Re), Niobium (Nb), Ni, gold (Au), aluminum (Al), tantalum (Ta), molybdenum (Mo), $NiSi_x$, titanium silicide (TiSi), titanium nitride (TiN), WSiN, Pt and the like. Thus, the source contact 115 and/or the drain contact 105 may contain an ohmic contact portion in direct contact with the layer 126. In some embodiments, the source contact 115 and/or the drain contact 105 may be formed of a plurality of layers to form an ohmic contact that may be provided as described, for example, in commonly assigned U.S. Pat. Nos. 8,563,372 and 9,214,352, the disclosures of which are hereby incorporated herein in their entirety by reference.

In operation, a two-dimensional electron gas (2DEG) layer 40 may be formed at a junction between the channel layer 124 and the barrier layer 126 when the HEMT device is biased to be in its conducting or "on" state. The 2DEG layer 40 acts as a highly conductive channel that allows current to flow between the source and drain regions that are beneath the source contact 115 and the drain contact 105, respectively. In particular, the channel layer 124 and the barrier layer 126 of the semiconductor structure 190 may be formed of materials having different bandgaps, such that a heterojunction is defined at an interface between the channel layer 124 and the barrier layer 126. In some embodiments, the substrate 122 includes silicon carbide, the channel layer 124 includes GaN, and the barrier layer 126 includes AlGaN. The 2DEG conduction channel 40 can be induced at the heterointerface between the channel layer 124 and the barrier layer 126. The channel layer 124, 2DEG conduction channel 40 and barrier layer 126 can generally form the active region of the HEMT device. It should be noted that while described herein primarily with reference to fabrication and structures of HEMT devices, the elements and concepts of embodiments described herein can be applied to many different types of transistor structures.

As noted above, improved performance can be achieved in accordance with some embodiments of the present invention by selectively modifying regions of semiconductor structure 190 adjacent the source and/or drain regions to provide localized charge control of the channel in those regions, without affecting regions adjacent to the gate 110. For example, a combination of surface treatment(s) and deposition process(es) may be used to optimize or modify the interface states near the gate, in a different way than the interface states will be modified adjacent the source and/or drain regions. As shown in FIGS. 1A to 1C, an initial or first surface passivation layer 150 is formed on a surface 126A of the semiconductor structure 190. The surface passivation layer 150 may be formed by a passivation process that results in low surface potential of the barrier layer 126, so as to reduce leakage current in regions 126G adjacent the gate 110. The surface passivation layer 150 may be a silicon nitride or other electrically insulating material layer formed using a relatively low surface energy process, which may not substantially increase the surface potential of the surface 126A. Such deposition processes may include PVD, PECVD, LPCVD, SACVD, thermolytic deposition, PEALD, ALD, and/or any combination thereof, which may form the surface passivation layer 150 as a single- or multi-layer stack. The deposition of the surface passivation layer 150 may modify surface states of the surface 126A. The thickness of the surface passivation layer 150 may affect the gate-to-source capacitance and the gate-to-drain capacitance, which can impact the switching speed of the device.

In some embodiments, the surface 126A may be treated by one or more surface treatment processes prior to deposition of the surface passivation layer 150. Such pre-passivation surface treatment processes may include in-situ processes and ex-situ processes. Example in-situ surface treatment processes may include, but are not limited to, plasma nitridation, ion bombardment, plasma oxidation, hydrogen ($H_2$) plasma treatment (which may result in nitrogen vacancies/deficiencies near the surface 126A), annealing in a chemically active gas environment (including but not limited to forming gas (e.g., a mixture of $H_2$ and $N_2$ of varying concentrations), nitric oxide, nitrogen dioxide, and ammonia), and annealing in a chemically inert gas environment. Example ex-situ surface treatment processes may include, but are not limited to, wet etching in an acidic chemical bath, wet etching in a basic chemical bath, and treatment in a neutral chemical solution (e.g., a buffered oxide etchant (BOE)).

The surface passivation layer 150 includes one or more openings 151, 151' (e.g., trenches) that extend therethrough and expose the passivated surface 126A of the semiconductor structure 190 in one or more regions. It will be understood that a when a region is "exposed" by a layer or opening, the region remains exposed by the layer or opening regardless of whether further layers or elements are subsequently formed on or covering the region. That is, "exposes" may define a relationship between the layer or opening and the region, independent of subsequent processes on the region. For example, the surface passivation layer 150 may be selectively etched to define the openings 151, 151'. The gate 110 may be formed on the surface 126A of the semiconductor structure 190 exposed by the opening 151, also referred to herein as the gate opening. The length of the gate 110 $L_G$ in the opening 151 defines an interface between the gate 110 and the barrier layer 126. The length $L_G$ may affect transconductance and gate parasitics, which may impact switching and efficiency of the device.

In some embodiments, the gate 110 may include one or more extended portions that laterally extend onto portions of the surface passivation layer 150, for example, opposing sidelobe portions 110-1, 110-2 that define a gamma ($\Gamma$)-shape (also referred to as a "T-gate") or a T-shape (also referred to as a "T-gate"). The gate 110 and sidelobe portion(s) 110-1, 110-2 can define multiple different lengths ($\Gamma_{G1}$ and $\Gamma_{G2}$), which may affect the gate-to-source or gate-to-drain capacitance, and thus, the switching speed and/or gain, of the device. The sidelobe portion(s) 110-1, 110-2 may extend asymmetrically or substantially symmetrically onto the surface passivation layer 150 at opposing sides of the gate 110 in some embodiments. For example, on the drain side, the sidelobe portion 110-2 of the gate 110 may extend towards the drain contact 105 by a distance $\Gamma_{G2}$, e.g., between about 0.05 µm and 0.5 µm. In some embodiments, $\Gamma_{G2}$ may be approximately 0.2 µm. On the source side, the sidelobe portion 110-1 of the gate 110 may extend towards the source contact 115 by a distance $\Gamma_{G1}$, e.g., between about 0.05 µm and 0.5 µm. In some embodiments, $\Gamma_{G1}$ may be approximately 0.1 µm.

The opening(s) 151' in the surface passivation layer 150 may be formed during the same etching process used to form the gate opening 151, or in a different etching process before or after forming the gate opening 151. The opening(s) 151' may have a same or different profile than the gate opening 151. The opening(s) 151' are laterally spaced apart from the gate opening 151, adjacent to the source contact 115 and/or the drain contact 105. In some embodiments, the opening(s) 151' are laterally spaced apart from an area where a field plate is to be formed between the gate 110 and the source or drain contacts 115 or 105. The opening(s) 151' may be laterally spaced apart or separated from the gate opening 151 (e.g., as measured from the top of the openings opposite the surface 126A) by a distance on the order of tens of nanometers (nm), for example, by about 10 nm (0.01 µm) or more, by about 100 nm (0.1 µm) or more, or by about 150 nm (0.15 µm) or more, as limited by the gate-to-drain or gate-to source spacing. In some embodiments, the minimum lateral spacing or separation between the opening(s) 151' and the gate opening 151 may correspond to the length $\Gamma_{G1}$, $\Gamma_{G2}$ of the gate sidelobe portion(s) 110-1, 110-2, which may define overhanging portions that protect underlying portions of the surface passivation layer 150 from the etching operations used to form the opening(s) 151'.

Region(s) 126S of the semiconductor structure 190 are exposed by the opening(s) 151' for processing, e.g., using surface treatment processes and/or deposition operations as described herein. In particular, the region(s) 126S exposed by the opening(s) 151' may be modified as described herein so as to provide a non-uniform variation in conductivity, sheet resistance, charge trap concentration, and/or surface potential along the lateral direction (e.g., the X direction) between the gate contact 110 and the drain contact 105 (or source contact 115). For example, one or more surface treatment processes may be performed to alter the surface characteristics of the regions 126S of the semiconductor structure 190 exposed by the opening(s) 151' to differ from surface characteristics of the regions 126G adjacent the gate 110. Such surface treatment processes may include in-situ processes (e.g., prior to deposition of subsequent layers, such as passivation layer 155), and ex-situ processes (e.g., prior to loading the semiconductor structure 190 into a passivation tool). Example in-situ surface treatment processes may include, but are not limited to, plasma nitridation, ion bombardment, plasma oxidation, hydrogen (H2) plasma treatment (which may result in nitrogen vacancies along the exposed region 126S/interface), annealing in a chemically active gas environment (including but not limited to forming gas, nitric oxide, nitrogen dioxide, and ammonia), and annealing in a chemically inert gas environment. Example ex-situ surface treatment processes may include, but are not limited to, wet etching in an acidic chemical bath, wet etching in a basic chemical bath, and treatment in a neutral chemical solution.

The surface treatment process(es) are configured to modify interface states in region(s) 126S exposed by the opening(s) 151'. For example, the surface treatment process(es) may locally alter interface states in the region(s)

126S exposed by the opening(s) 151' so as to reduce sheet resistance or otherwise form higher-conductivity regions 126S of the conduction channel 40 underneath the modified surface between the gate 110 and the source or drain contacts 115 or 105 (as compared to the regions 126G adjacent the gate 110). In some embodiments, the etching process used to form the opening(s) 151' may also remove particular interface states that were modified prior to deposition of the surface passivation layer 150 (e.g., by pre-passivation surface treatment processes described above), or may otherwise modify the interface states of the regions 126S exposed by the opening(s) 151', with further modification of the interface states of the regions 126S by the surface treatment process(es) performed after forming the opening(s) 151'.

In particular, FIG. 1A illustrates formation of a higher-conductivity region 126S in the surface 126A between the gate 110 and the drain electrode 105; FIG. 1B illustrates formation of a higher-conductivity region 126S in the surface 126A between the gate 110 and the source electrode 115; and FIG. 1C illustrates formation of higher-conductivity regions 126S in the surface 126A between the gate 110 and the drain electrode 105 and between the gate 110 and the source electrode 115. In some embodiments, the region(s) 126S may also be referred to herein as surface-treated regions or modified interface regions.

As the opening(s) 151' are laterally spaced apart from the gate opening 151, the surface-treated region(s) 126S are laterally separated or offset from the gate 110. That is, the surface-treated regions 126S are separated from the gate 110 by the regions 126G, which may be free of interface modification by the surface treatment process(es) or may otherwise have different surface characteristics than the surface-treated regions 126S. For example, as noted above, the regions 126G may include differently modified interface states (as compared to the regions 126S) due to pre-passivation surface treatment process(s) and/or etching process(es) that define the different surface characteristics. The modified surface/interface region 126S may improve a conductivity and/or sheet resistance of the active region of the transistor device so as to improve performance of the device. However, the same characteristics that may improve the performance of the device when present in the source access region and/or drain access region may increase leakage current if too near the gate contact 110, which may reduce the breakdown performance and reliability performance of the device. By distancing the modified surface/interface region 126S from the gate 110 by an offset distance, embodiments of the present invention may provide improved conductivity and performance in the source access region and/or drain access region 126S without substantially affecting the regions 126G adjacent the gate 110, thus avoiding an increase in leakage current.

A second insulating or interlayer passivation layer (e.g., an Inter Field Plate Passivation (IFPP)) 155 is formed on the surface passivation layer 150 and on the regions 126S of the semiconductor structure 190 exposed by the opening(s) 151', so as to define an interface between the regions 126S and the interlayer passivation layer 155. Characteristics of the interface between the first insulating layer 150 and the barrier layer 126 adjacent the gate 110 may be different from the modified surface/interface region 126S in the drain access region and/or in the source access region. For example, in some embodiments, interface states, conductivity, sheet resistance, charge trap concentration, and/or surface potential at the interface (corresponding to region 126G) between the surface passivation layer 150 and the barrier layer 126 may be different than that at the interface (corresponding to region 126S) between interlayer passivation layer 155 and the barrier layer 126.

The non-uniform variation in interface states, conductivity, sheet resistance, charge trap concentration, and/or surface potential may thus be provided along the interface(s) between the surfaces 126A, 126S and the passivation layers 150, 155 in the lateral direction between the gate contact 110 and the drain contact 105 (or source contact 115). In some embodiments, the interlayer passivation layer 155 may be formed closely or immediately after the surface treatment process(es) so as to preserve the surface modification of region 126S achieved by the surface treatment. The interlayer passivation layer 155 may be formed using a relatively higher surface energy process, such as PVD, PECVD, LPCVD, SACVD, thermolytic deposition, PEALD, ALD, and/or any combination thereof, which may form the interlayer passivation layer 155 as a single- or multi-layer stack.

In some embodiments, the modified interface states at the interface (corresponding to region 126S) between interlayer passivation layer 155 and the barrier layer 126 may be defined by deposition of the interlayer passivation layer 155 itself, independent of or in addition to any surface treatment process(es). That is, the non-uniform variation in interface states, conductivity, sheet resistance, charge trap concentration, and/or surface potential as described herein may be achieved by any combination of surface treatment(s) and deposition process(es), including for example, pre-passivation surface treatment process(es), deposition and/or etching of the surface passivation layer 150, subsequent surface treatment process(es), and/or deposition of the interlayer passivation layer 155. The higher-conductivity region(s) 126S thus extend along and/or beneath respective interfaces between portions of the surface 126A of the semiconductor structure 190 exposed by the opening(s) 151' and the interlayer passivation layer 155.

The surface passivation layer 150 and the interlayer passivation layer 155 may each include a single layer or multiple layers. For example, the surface passivation layer 150 and the interlayer passivation layer 155 may include one or more layers of silicon nitride, silicon oxide, silicon oxynitride, aluminum oxide, or a multilayer insulator structure, such as an oxide-nitride-oxide layer. In particular embodiments, the surface passivation layer 150 and the interlayer passivation layer 155 may each include silicon nitride. Additional passivation layers (e.g., final passivation layer 560 shown in FIG. 5F) and/or metal contacts (e.g., metal contacts 565 shown in FIG. 5F) may be formed for electrical connection, e.g., for "off-chip" input or and/or output connections to one or more external devices, and/or for ground connections. The metal contacts may be directly or indirectly connected to corresponding terminals of one or more transistor structures 100a, 100b, 100c (e.g., gate 110, drain 105, and source 115 terminals, and may thus define input (e.g., gate), output (e.g., drain), and/or ground (e.g., source) contact pads or terminals of a HEMT device, as discussed below with reference to FIG. 7.

Although illustrated primarily herein with reference to planar HEMT configurations with the gate 110 and the source and drain electrodes 115, 105 on the surface 126A of the barrier layer 126, it will be understood that embodiments of the present invention may be used in other HEMT configurations, such as recessed gate HEMTs (where the source and drain electrodes 115, 105 are elevated relative to the gate 110 on the surface 126A) and recessed source/drain HEMTs (where the source and drain electrodes 115, 105 extend toward the channel layer 124 beyond the surface 126A).

Figure 2:
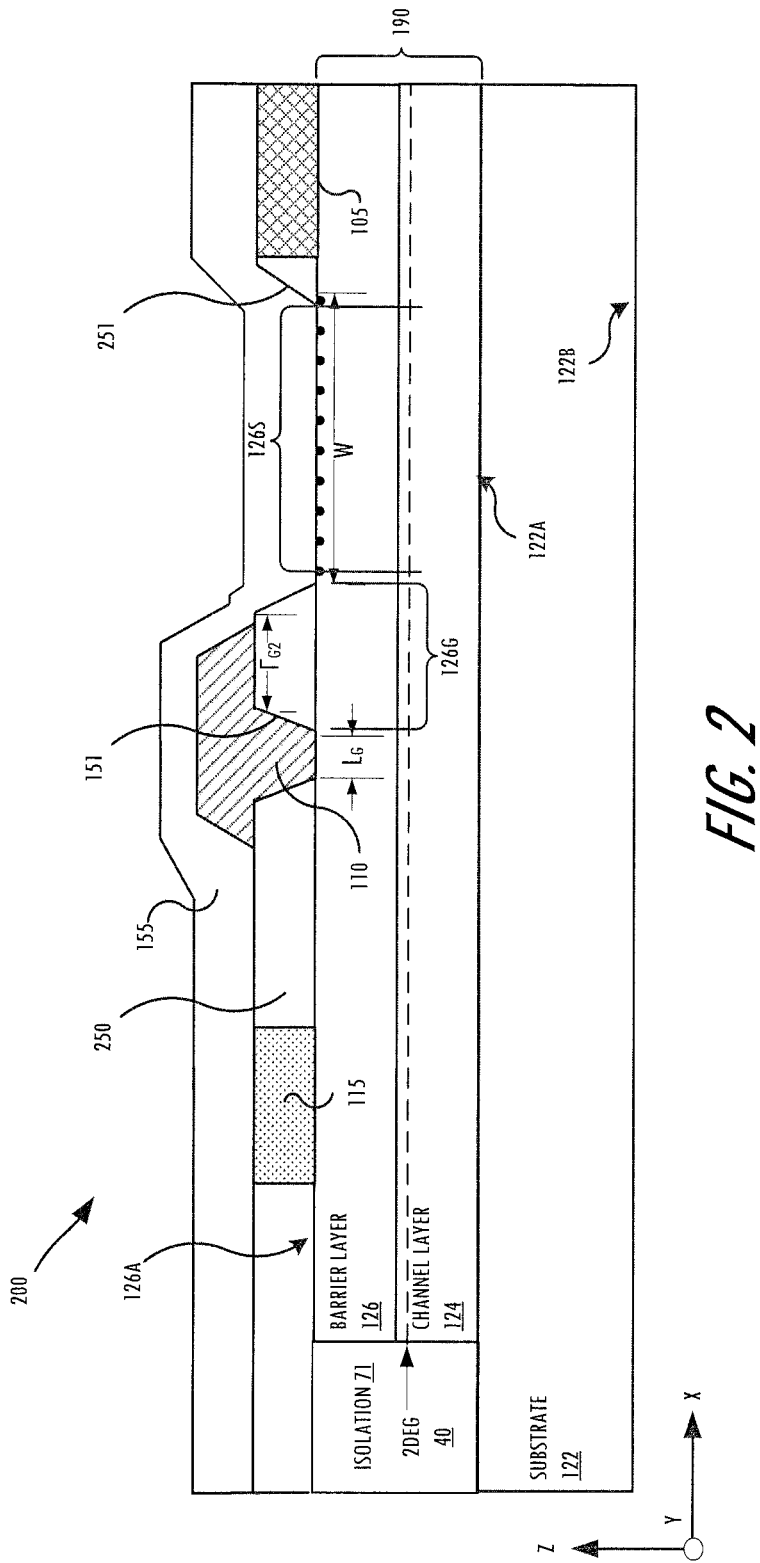
FIG. 2 is a schematic cross-sectional view of a transistor device including higher-conductivity source and/or drain access regions according to some embodiments of the present invention.

FIG. 2 is a schematic cross-sectional view of a transistor structure 200 according to some embodiments of the present invention. The transistor structure 200 includes a substrate 122, semiconductor structure 190, gate 110, and source and drain contacts 115 and 105 that are similar to the embodiments of FIGS. 1A to 1C. The transistor structure 200 further includes a surface passivation layer 250 with wider opening 251 and a larger surface-treated region 126S as compared to those of the transistor structure 100a. While illustrated by way of example with reference to the opening 251 between the gate 110 and the drain contact 105, it will be understood that a similar or differently-dimensioned opening in the surface passivation layer 250 may likewise be provided between the gate 110 and the source contact 115, additionally (as in FIG. 1C) or alternatively (as in FIG. 1B).

As shown in FIG. 2, the opening 251 in the surface passivation layer 250 may have a width dimension W along a lateral (e.g., X–) direction between the gate 110 and the drain contact 105 (or source contact 115). The opening(s) 251 may expose up to a majority of (but less than an entirety of) the surface 126A between the gate 110 and the drain or source contacts 115 or 105, illustrated in FIG. 1A as the gate-to-drain spacing $L_{GD}$ or the gate-to-source spacing $L_{GS}$. The lateral distance $L_{GD}$ between the gate 110 at the bottom of the gate opening 151 and the drain contact 105 may be between 1.75 µm and 4 µm, for example, about 1.98 µm. The lateral distance $L_{GS}$ between the gate contact 110 at the bottom of the gate opening 151 and the source contact 115 may be between 0.5 µm and 1 µm, for example, about 0.6 µm.

The opening(s) 251 may be laterally separated or spaced apart from the gate 110 (e.g., as measured along the surface 126A at the bottom of the opening(s)) in some embodiments by a distance corresponding to the length $\Gamma_{G1}$, $\Gamma_{G2}$ of the gate extension(s) 110-1, 110-2. In some embodiments, the opening(s) 251 may laterally extend adjacent or up to the drain contact 105 (and/or source contact 105). For example, for a device having a gate-to-drain spacing $L_{GD}$ of about 1.98 µm and a gate sidelobe length $\Gamma_{G2}$ of about 0.05 µm on the drain side, the width W of the opening 251 may be up to about 1.975 µm ($L_{GD}$ minus $\Gamma_{G2}$) or less. Likewise, for a device having a gate-to-source spacing $L_{GS}$ of about 0.6 µm and a gate sidelobe length $\Gamma_{G1}$ of about 0.05 µm on the source side, the width W of the opening 251 may be up to about 0.55 µm ($L_{GS}$ minus $\Gamma_{G1}$) or less. More generally, the width W of the opening 251 may correspond to the difference between the gate-to-drain spacing $L_{GD}$ (or the gate-to-source spacing $L_{GS}$) and the desired lateral spacing of the region 126S exposed by the opening 251 from the surface exposed by the gate opening 151.

Due to the larger dimensions of the opening(s) 251, comparatively larger region(s) 126S of the passivated surface 126A may be exposed to the one or more surface treatment processes described above with reference to FIGS. 1A to 1C, such that the surface-treated region(s) 126S have different surface characteristics than regions 126G of the semiconductor structure 190 adjacent the gate 110. In particular, the region(s) 126S may include modified interface states as compared to the regions 126G adjacent the gate 110. The region(s) 126S may be formed over up to a majority of the gate-to-drain spacing $L_{GD}$ (and/or the gate-to-source spacing $L_{GS}$). As noted above, the region(s) 126S may be laterally separated or offset (e.g., by as low as $\Gamma_{G2}$ or $\Gamma_{G1}$) from the gate 110 by the regions 126G so as to avoid increased leakage current.

FIG. 2 illustrates such higher-conductivity regions 126S between the in the surface 126A between the gate 110 and the drain contact 105 by way of example, but it will be understood that a similar higher-conductivity region may be provided (additionally or alternatively) between the gate 110 and the source electrode 115. That is, while shown on the drain side of the transistor structure 200 of FIG. 2, embodiments of the present invention may additionally or alternatively include the wider opening 251 and the surface-treated regions 126S on the source side of the transistor structure 200.

As in FIGS. 1A to 1C, a second or interlayer passivation layer (e.g., an IFPP) 155 is formed on the surface passivation layer 250 and in the opening(s) 251, such that the surface-treated region(s) 126S extend along one or more interfaces between the portions(s) of the surface 126A exposed by the opening(s) 251 and the interlayer passivation layer 155.

Figure 3A:
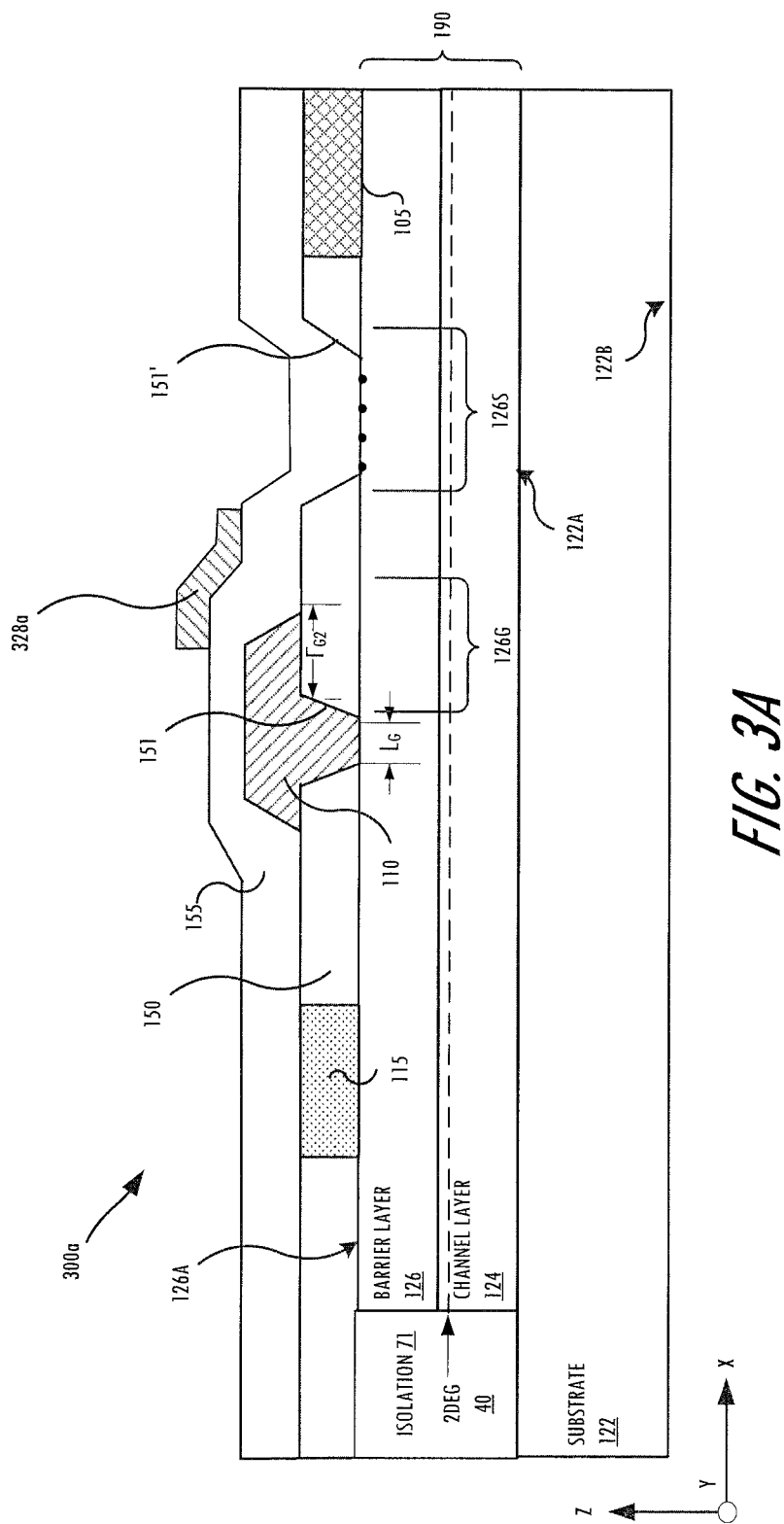
FIGS. 3A, 3B, and 3C are schematic cross-sectional views of transistor devices including higher-conductivity source and/or drain access regions with various configurations of field plates according to some embodiments of the present invention.
Figure 3B:
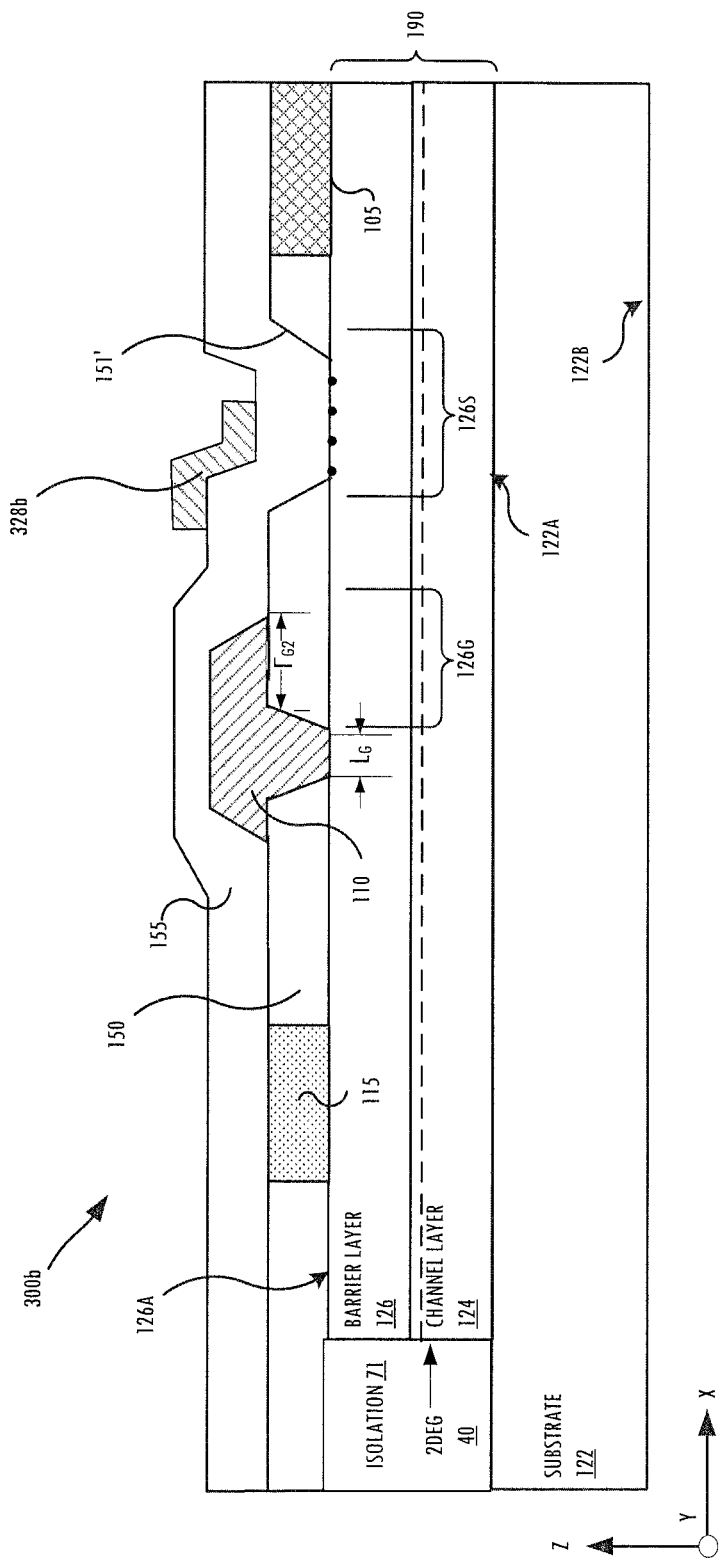
Figure 3C:
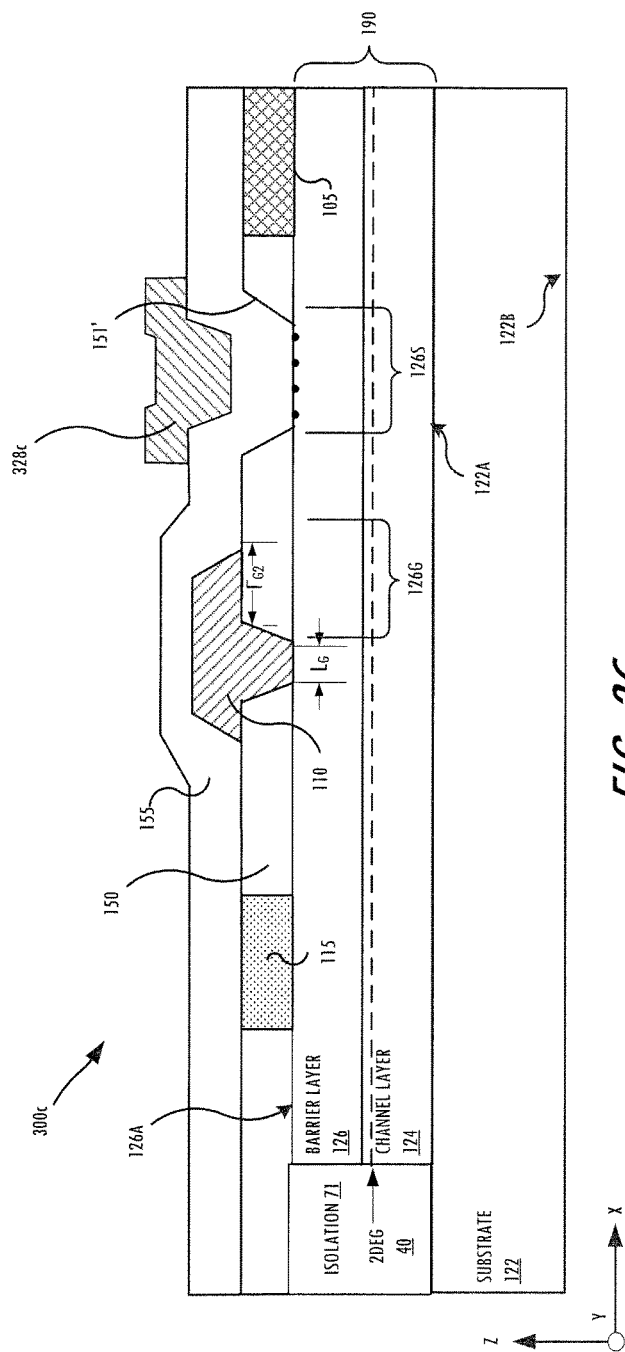

FIGS. 3A, 3B, and 3C are schematic cross-sectional views of transistor structures 300a, 300b, 300c including various configurations of field plates 328a, 328b, 328c (collectively 328) according to some embodiments of the present invention. The field plates 328a, 328b, 328c may be used to enhance the performance of HEMTs, for example, at microwave frequencies. For example, the field plates 328a, 328b, 328c may be configured to reduce the peak electric field in the transistor structures 300a, 300b, 300c, which can result in increased breakdown voltage and reduced charge trapping. The reduction of the electric field can also yield other benefits such as reduced leakage currents and enhanced reliability. Field plates and techniques for forming field plates are discussed, by way of example, in U.S. Pat. No. 8,120,064, the disclosure of which is hereby incorporated herein in its entirety by reference.

As shown in FIGS. 3A to 3C, the field plate 328 is spaced apart from the gate 110 by the interlayer passivation layer 155, and is spaced apart from the barrier layer 126 by the interlayer passivation layer 155 and the surface passivation layer 150. The field plate 328 laterally extends toward the drain contact 105 on the drain side of the structure 300a, 300b, 300c, and may be electrically connected to the gate 110 (by a connection outside the active region of the transistor structure 300a, 300b, 300c). This configuration can result in a reduction of the electric field on the gate-to-drain side of the transistor structure, thereby increasing breakdown voltage and reducing the high-field trapping effect. The extension distance of the field plate 328 beyond the gate 110 may affect the gate-to-source capacitance and the breakdown voltage of the device, which may impact the voltage rating and switching speed of the device.

In some embodiments, the field plate 328 may be electrically connected to the source contact 115. Connecting the field plate 328 to the source contact 115 may affect the gate-to-drain capacitance ($C_{gd}$), which consequently can enhance the gain of the device. In addition to reducing gate-to-drain capacitance $C_{gd}$, the presence of the field plate 328 may improve linearity of the device and/or reduce the drain bias dependence of the capacitance.

The field plate 328 may be implemented on the interlayer passivation layer 155 in various configurations in accordance with embodiments of the present invention. In FIG. 3A, the field plate 328a conformally extends along the interlayer passivation layer 155 over a portion of the gate 110, so as to partially overlap with the gate 110 in the vertical (e.g., Z–) direction. In FIGS. 3B and 3C, the field plate 328b, 328c does not extend over the gate 110, and is laterally spaced apart from the gate 110 by the interlayer passivation layer 155, so as to be free of overlap with the gate 110 in the vertical direction.

In FIGS. 3A and 3B, the field plate 328a, 328b has a stepped profile including two or more portions, with a first step portion adjacent the gate 110 and a second step portion adjacent the drain contact 105. The stepped field plate 328a, 328b may be defined by a continuous layer, or by a stack of discontinuous layers. Each step portion of the field plate 328a, 328b is positioned at a different distance or spacing from the surface 126A (and thus, the underlying conduction channel 40). The field plate 328a, 328b including first and second step portions at closer and farther distances or spacings from the conduction channel 40 may allow for reduction of $C_{gd}$ and trapping effects, as well as reduction in peak electric field proximate the drain contact 105.

In FIG. 3A, the field plate 328a is completely outside of or otherwise does not overlap with the opening 151' in the surface passivation layer 150 that exposes the surface-treated region 126S. That is, the opening 151' in the surface passivation layer 150 and the region 126S may be between the field plate 328a and the drain contact 105, and may be laterally spaced apart from (and thus free of overlap with) the field plate 328a. In FIG. 3B, the field plate 328b extends along the interlayer passivation layer 155 so as to partially extend into or overlap with the opening 151' in the surface passivation layer 150. As such, the field plate 328b at least partially overlaps with the opening 151' in the surface passivation layer 150 and the surface-treated region 126S.

In FIG. 3C, the field plate 328c extends along the interlayer passivation layer 155 so as to conformally extend along the portion of the layer 155 in the opening 151' in the surface passivation layer 150. As such, the field plate 328c completely overlaps with the opening 151' in the surface passivation layer 150 and the surface-treated region 126S. As shown in the example of FIG. 3C, the field plate 328c has a T-shaped configuration including a central recessed portion above the opening 151' and one or more wing portions extending laterally from the recessed portion toward the source contact 115 and toward the drain contact 105. Adjusting the distances between central portion and/or the wings of the field plate 328c and the barrier layer 126, as well as the widths of the field plates 328 and/or the widths of the lateral extensions thereof provides a number of degrees of freedom for modulating the gate-to-source and gate-to-drain capacitances of the device.

Figure 4B:
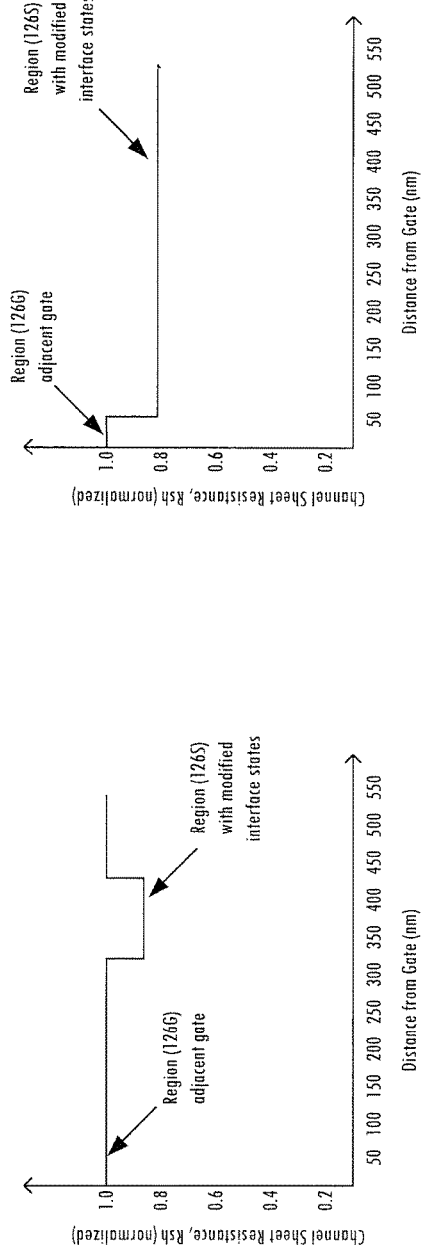
FIGS. 4A and 4B are graphs illustrating non-uniform variation in sheet resistance between the gate and source or drain regions in transistor devices according to some embodiments of the present invention.
Figure 4A:
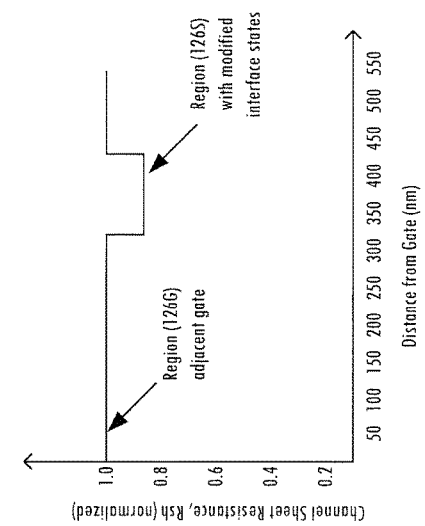

FIGS. 4A and 4B are graphs illustrating non-uniform variation in sheet resistance $R_{sh}$ in the lateral direction between the gate and the drain (or source) resulting from modified interface states according to some embodiments of the present invention. As shown in FIGS. 4A and 4B, the sheet resistance $R_{sh}$ is relatively uniform at regions 126G of the semiconductor structure 190 adjacent the gate 110, but is locally reduced in the surface-treated region 126S (illustrated as lowered by about 10% in FIG. 4A and by about 20% in FIG. 4B, although embodiments of the present invention are not limited thereto). As noted above, the surface treatment process may be used to locally modify surface characteristics such as interface states in the region 126S corresponding to the opening 151', 251 in the surface passivation layer 150. Without being bound to theory, the modified interface states in the region 126S may result in increased surface potential than regions 126G adjacent the gate 110. More generally, the sheet resistance $R_{sh}$ and/or charge trap concentration is reduced (and thus conductivity is increased) as a result of the localized interface state modification in the surface-treated region 126S, while the regions 126G more directly or immediately adjacent to the gate 110 may be substantially unaffected by the surface treatment or may otherwise have different characteristics, providing for low leakage adjacent the gate 110.

As shown in the examples of FIGS. 4A and 4B, the modified interface states in region 126S provide a non-uniform variation in sheet resistance, charge trap concentration, conductivity, and/or surface potential along the interface(s) between the surface 126A of the semiconductor structure 190 and the passivation layer(s) 150, 155 that may be abrupt or stepwise in some embodiments. While discussed primarily with reference to the non-uniform variation over the gate-to-drain spacing $L_{GD}$, it will be understood that a similar or proportional variation may be additionally or alternatively provided over the gate-to-source spacing Los. FIG. 4A illustrates a more local variation, for example, in embodiments with the opening 151' in the surface passivation layer 150 shown in FIGS. 1A to 1C. FIG. 4B illustrates the reduced sheet resistance $R_{sh}$/higher conductivity region 126S may extend over up to a majority of the gate-to-drain spacing $L_{GD}$ (and/or the gate-to-source spacing $L_{GS}$), for example, in embodiments with wider opening(s) 251 in the surface passivation layer 150 between the gate 110 and drain contact 105 (and/or source contact 105) as shown in FIG. 2. More generally, however, the non-uniform variation in sheet resistance, charge trap concentration, conductivity, and/or surface potential may be provided anywhere between the gate and the source or drain contact, so long as the lateral spacing or offset with the gate (e.g., by as low as $\Gamma_{G2}$ or $\Gamma_{G1}$) is maintained. In some embodiments, the non-uniform variation in sheet resistance, charge trap concentration, conductivity, and/or surface potential may be achieved by performing one or more surface treatment processes before forming the surface passivation layer 150 and altering the surface characteristics using a self-aligned gate fabrication process, as described for example in commonly owned U.S. Patent Application No. 17/325,628, the disclosure of which is incorporated by reference herein.

FIGS. 5A, 5B, 5C, 5D, 5E, and 5F are schematic cross-sectional views illustrating example intermediate fabrication steps in methods for fabricating transistor structures according to some embodiments of the present invention. FIG. 6 is a flowchart illustrating methods of fabricating transistor structures in accordance with some embodiments of the present invention.

Figure 5A:
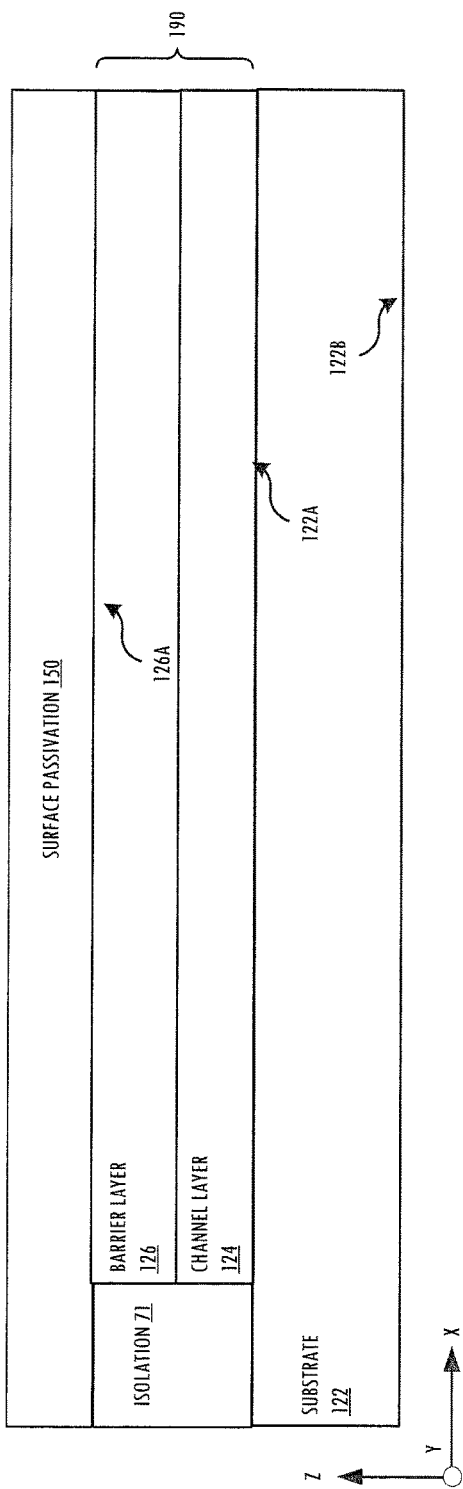
Figure 6:
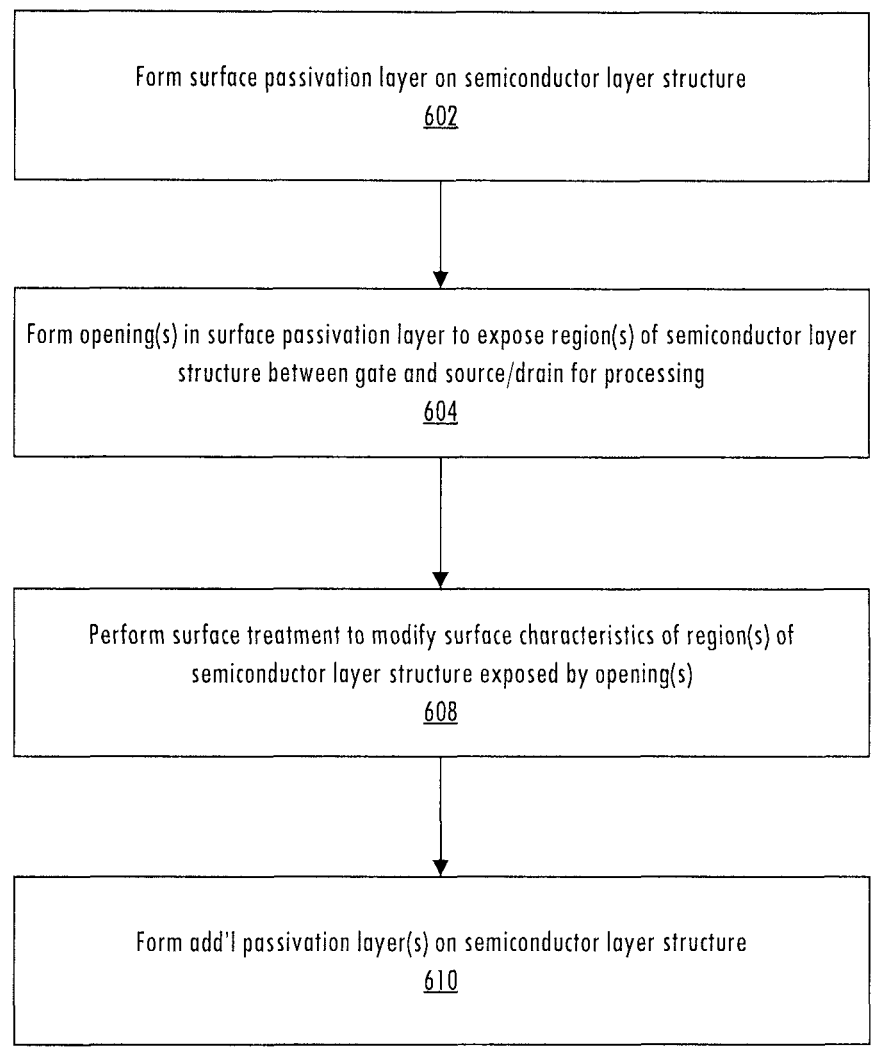
FIG. 6 is a flowchart illustrating methods of fabricating transistor structures in accordance with some embodiments of the present invention.

Referring now to FIG. 5A and FIG. 6, a surface passivation layer 150 is formed on a semiconductor structure 190 on a substrate 122 (block 602). As noted above, the semiconductor structure 190 may define one of a plurality of unit cell structures (e.g., 100, 200, 300) on the substrate 122. The substrate 122 may include silicon carbide, sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), or other materials, which may be capable of supporting growth of Group III-nitride materials. As an example, silicon carbide may have a closer crystal lattice match to Group III than sapphire, and may allow for formation of higher-quality Group III nitride films thereon. Silicon carbide also has a very high thermal conductivity, such that the total output power of Group III nitride devices on silicon carbide may not be as limited by the thermal dissipation of the substrate (as may be the case with some devices formed on sapphire). However, embodiments of the present invention are not limited to silicon carbide, and may utilize any suitable material for the substrate 122.

In the illustrated embodiments, the semiconductor structure 190 includes a channel layer 124 and a barrier layer 126. The channel layer 124 and/or the barrier layer may be deposited on the substrate 122 using buffer layers, transition layers, and/or nucleation layers as described above. The channel layer 124 and the barrier layer 126 may be formed of materials having different bandgaps (e.g., GaN and AlGaN, respectively) so as to define a heterojunction of a HEMT device, but embodiments of the present invention are not limited thereto. In some embodiments, the channel layer 124 and the barrier layer 126 may have different lattice constants, for example, with a smaller lattice constant for the relatively thin barrier layer 126 such that the barrier layer 326 "stretches" at the interface between the two. Accordingly, a pseudomorphic HEMT (pHEMT) device may be provided.

The surface passivation layer 150 may be formed by a passivation process that results in low surface potential of the surface 126A of the semiconductor structure 190. The surface passivation layer 150 may be dielectric material, such as silicon nitride ($Si_xN_y$), aluminum nitride (AlN), silicon dioxide ($SiO_2$), and/or other suitable protective material. Other materials may also be utilized for the surface passivation layer 150. For example, the surface passivation layer 150 may also include magnesium oxide, scandium oxide, aluminum oxide and/or aluminum oxynitride. Furthermore, the surface passivation layer 150 may be a single layer or may include multiple layers of uniform and/or non-uniform composition. For example, the surface passivation layer 150 may be a silicon nitride or other electrically insulating material layer that is blanket-formed on the surface 126A of the semiconductor structure 190 using a relatively low surface energy process, such as PVD, PECVD, LPCVD, SACVD, thermolytic deposition, PEALD, ALD, and/or any combination thereof, so as to modify surface states of the surface 126A without increasing the surface potential of the surface 126A. The surface passivation layer 150 may be sufficiently thick so as to protect the underlying surface 126A during a subsequent processing, e.g., annealing of ohmic contacts. As noted above, forming of the surface passivation layer 150 may be preceded by one or more pre-passivation surface treatment processes in some embodiments, which may modify interface states of the surface 126A prior to deposition of the surface passivation layer 150 thereon.

Figure 5B:
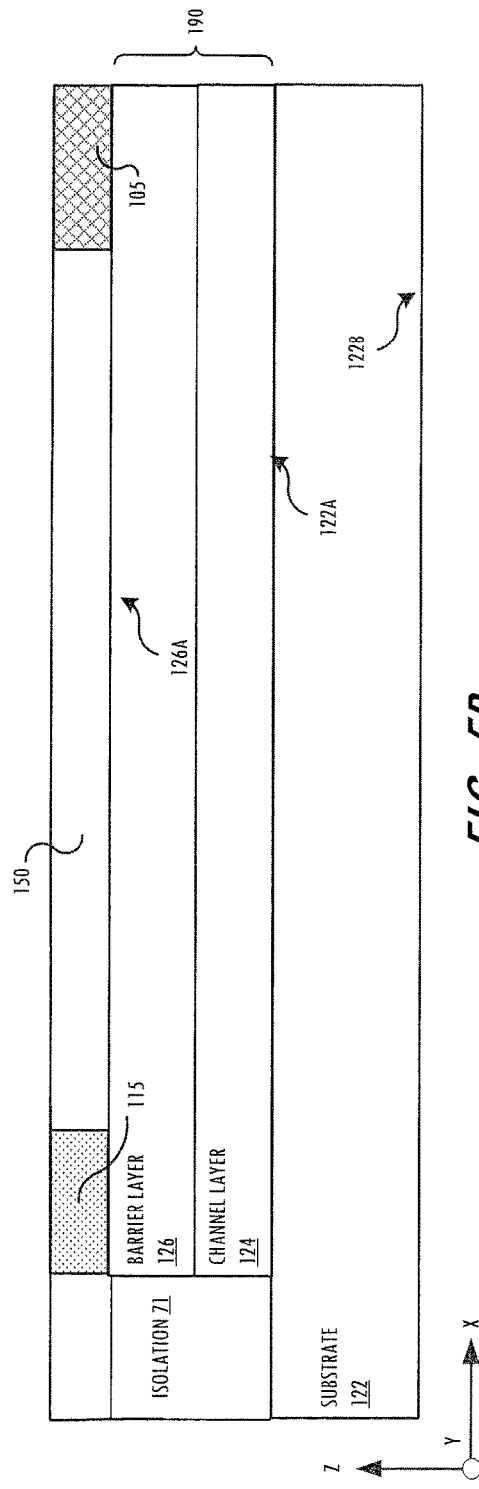

As shown in FIG. 5B, the surface passivation layer 150 is patterned to form source contacts 115 and drain contacts 105. For example, the surface passivation layer 150 may be patterned to form openings which expose the surface 126A of the barrier layer 126 for placement of the source contact 115 and the drain contacts 105. The openings may be etched utilizing a patterned mask and a low-damage etch with respect to the barrier layer 126. Ohmic metal may be formed on the exposed portions of the barrier layer 126. However, it will be understood that in other embodiments the barrier layer 126 may also be recessed through the openings, and the source and drain contacts 115 and 105 may extend through the barrier layer 126. Suitable metals may include Ti, W, TiW, Si, TiWN, WSi, Re, Nb, Ni, Au, Al, Ta, Mo. $NiSi_x$, TiSi, TiN, WSiN, Pt and the like. The ohmic metal may be annealed to provide the source contacts 115 and the drain contacts 105.

The surface passivation layer 150 may also be patterned to provide the gate contacts 110, e.g., before, after, or concurrently with forming the source and drain contacts 115 and 105. The surface passivation layer 150 may be etched to form an opening or trench 151 that exposes the surface 126A of the barrier layer 126 for placement of the gate contact 110. The gate contacts 110 may be formed within the etched opening 151, and may extend through the opening 151 to contact the exposed portion of the barrier layer 126. Suitable gate materials may include Ni, Pt, $NiSi_x$, Au, Ti, Cu, Pd, Cr, TaN, W, and/or WSiN. The trench 151 (and thus the gate 110 therein) may extend in the Y-direction along the surface 126A. Also, portions or sidelobes of the gate 110 may laterally extend (e.g., in the X-direction) on a surface passivation layer 150. Though illustrated as being on the surface 126A of the barrier layer 126 in FIG. 5C, it will be understood that the source contacts 115, gate contacts 110, and/or drain contacts 105 may be formed within recesses in the surface 126A of the barrier layer 126 in some embodiments.

Figure 5C:
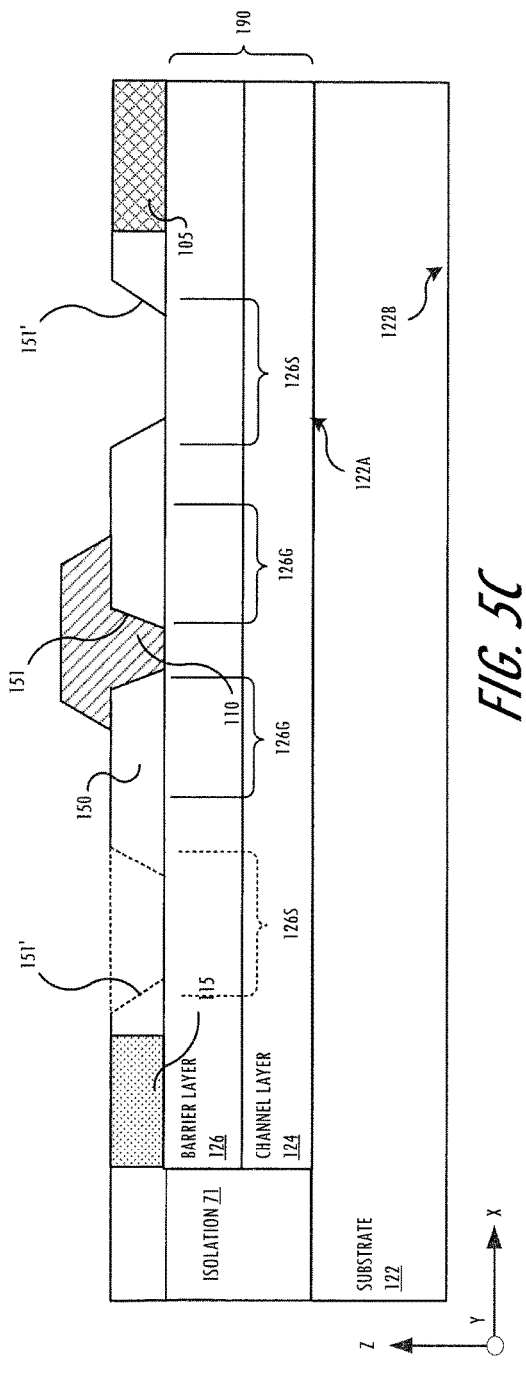

As shown in FIG. 5C and FIG. 6, the surface passivation layer 150 is etched to define one or more openings 151' that expose regions 126S of the semiconductor structure 190 (block 604). For example, the opening(s) 151' may define trenches that extend in the Y-direction along the surface 126A. The opening(s) 151' are formed between the gate 110 and the drain contact 105 (and/or between the gate 110 and the source contact 115, shown in phantom in FIG. 5C). The opening(s) 151' are laterally spaced apart from the gate opening 151, adjacent to the drain contact 105 (and/or to the source contact 115).

In some embodiments, the opening(s) 151' in the surface passivation layer 150 may be formed during the same etching process used to form the gate opening 151, or in a different etching process before or after forming the gate opening 151 and/or openings for the source and drain contacts 115 and 105. For example, in a GaN-based semiconductor structure 190 including a GaN channel layer 124 and an AlGaN barrier layer 126, during the etch used to form the gate opening 151, one or more additional openings 151' are etched into the surface passivation layer 150 to expose one or more regions 126S of the AlGaN barrier layer 126 between where the gate 110 is to be formed and where the drain contact 105 (and/or the source contact 115) is to be formed. In embodiments where pre-passivation surface treatment processes are performed, the etching process used to define the opening(s) 151' may also remove or modify the interface states of the regions 126S exposed by the opening(s) 151'.

Figure 5D:
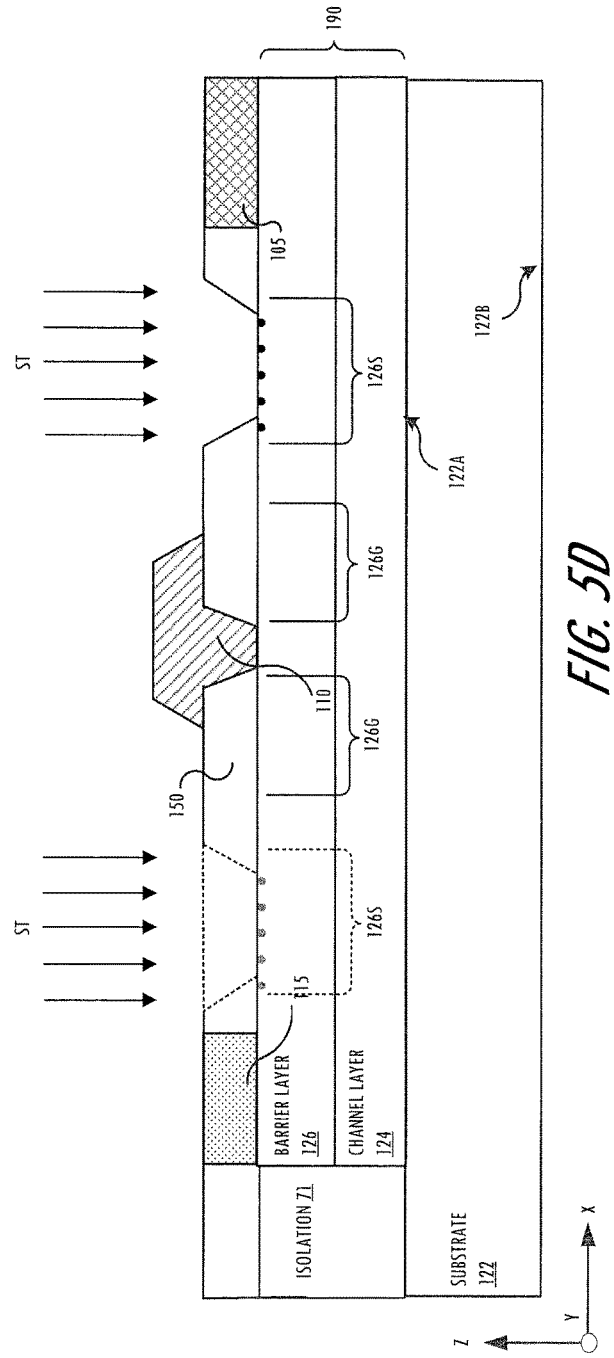

As shown in FIG. 5D and FIG. 6, one or more surface treatment processes ST are performed to modify surface characteristics of the region(s) 126S of the semiconductor structure 190 exposed by the opening(s) 151' (block 608). The surface treatment process(es) ST are configured to modify interface states in region(s) 126S exposed by the opening(s) 151'. The surface treatment process(es) may include, but are not limited to, in-situ processes (e.g., plasma nitridation, ion bombardment, plasma oxidation, H2 plasma treatment, annealing in a chemically active gas environment (including but not limited to forming gas, nitric oxide, nitrogen dioxide, and ammonia), and annealing in a chemically inert gas environment), and ex-situ processes (e.g., wet etching in an acidic chemical solution, wet etching in a basic chemical solution, and treatment in a neutral chemical solution).

For example, in the GaN-based semiconductor structure 190 including the exposed regions 126S of the AlGaN barrier layer 126, ion bombardment may be used to modify interface states (and may thus raise the AlGaN surface potential) in regions 126S exposed by the openings 151'. This forms high conductivity, low sheet resistance regions 126S in portions of the conduction channel 40, which may allow for higher saturation power and lower charge trapping. The regions more directly or immediately adjacent to the gate 110 may be unaffected by the surface treatment(s) ST, and thus may retain the lower surface potential resulting from the formation of the first/surface passivation layer 150 (at block 602), providing for low leakage adjacent the gate 110. That is, the surface treatment process(es) ST may locally modify interface states in the region(s) 126S exposed by the opening(s) 151', thereby forming surface-treated regions 126S between the gate 110 and the source or drain contacts 115 or 105 that provide higher conductivity in underlying portions of the conduction channel 40.

FIGS. 5E to 5F and FIG. 6 illustrate that one or more additional passivation layers 155, 560 (e.g., an interlayer passivation layer 155 and a final passivation layer 560) are formed on the semiconductor structure 190 (block 610). The additional passivation layer(s) 155, 560 may be insulating or dielectric layer(s), in some embodiments having a different dielectric index than the surface passivation layer 150. As shown in FIG. 5E, the interlayer passivation layer 155 may be an IFPP formed on the first/surface passivation layer 150 and on the regions 126S of the semiconductor structure 190 exposed by the opening(s) 151', with the surface-treated region(s) 126S extending along the interface(s) between the surface 126A and the interlayer passivation layer 155. The interlayer passivation layer 155 is formed (at block 610) closely or immediately after the surface treatment process(es) ST (at block 608), so as to maintain or preserve the surface characteristics in the region 126S achieved by the surface treatment P. As noted above, the interlayer passivation layer 155 may be formed using a relatively higher surface energy process, such as PVD, PECVD, LPCVD, SACVD, thermolytic deposition, PEALD, ALD, and/or any combination thereof, which may form the interlayer passivation layer 155 as a single- or multi-layer stack As noted above, the modified interface states in region 126S may be defined by deposition of the interlayer passivation layer 155 independent of or in addition to any surface treatment process(es). For example, the operations shown in FIG. 5D may be omitted in some instances, and the modified interface states in region 126S may be defined by deposition of the interlayer passivation layer 155 itself.

As shown in FIG. 5F, respective metal contacts 565 may be formed extending through openings in the interlayer passivation layer 155 to contact one or more of the contacts 105, 110, 115. For example, the interlayer passivation layer 155 may be patterned to form openings which expose the source contacts 115 and/or the drain contacts 105, and conductive metal may be formed on the exposed portions of the source contacts 115 and/or the drain contacts 105 to form the metal contacts 565. The metal contacts 365 may contain metal or other highly conductive material, including, for example, copper, cobalt, gold, and/or a composite metal. In the example of FIG. 5F, the metal contacts 565 are provided on the drain contact 505 and source contact 515, but it will be understood that the metal contacts 565 may be provided on all three terminals (i.e., source, gate, and drain) in some embodiments. In some embodiments, a field plate 328 may be formed on the IFPP 155, for example, according to the configurations shown in FIGS. 3A to 3C.

Still referring to FIG. 5F, an electrically insulating and/or passivating layer 560 (of similar or different composition than the insulating layers 150 and/or 155) may be formed on the metal contacts 565 as a final passivation layer, and may be patterned to define openings that expose the metal contacts 365 for electrical connections, e.g., input or and/or output connections to one or more external devices and/or for ground connections. The metal contacts 565 may thus define input (e.g., gate), output (e.g., drain), and/or ground (e.g., source) contact pads or terminals, which may be directly or indirectly connected to corresponding terminals (e.g., gate 110, drain 105, and source 115 terminals of a HEMT device) of any of the transistor structures 100a, 100b, 100c, 200, 300a, 300b, 300c described herein.

In contrast to some conventional devices (e.g., GaN/AlGaN HEMTs) in which only a gate opening is etched into the surface passivation layer and the interface states of the channel region may be set by the passivation process used to form the first or surface passivation layer, embodiments of the present invention may provide higher-conductivity regions in a portion of (or a majority of) the semiconductor structure between the gate and the source and/or drain contacts, for example, by forming one or more additional openings in the surface passivation layer. This allows for local modification of the interface states of the regions of the semiconductor structure exposed by the openings, to create the higher conductivity regions without affecting the area or regions directly adjacent to the gate. More generally, embodiments of the present invention may differently modify interface states in first regions of the semiconductor structure adjacent the source or drain as compared to second regions adjacent the gate, using any combination of surface treatment process(es) and/or passivation layer deposition steps, including but not limited to those described by way of example above.

Embodiments of the present invention may be formed as discrete devices, or may be formed as part of a Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel. Embodiments of the present invention provide transistor designs that can produce higher power densities, allowing for smaller and more powerful MMIC chips.

Embodiments of the present invention may provide improved performance in RF devices. However, embodiments of the present invention are not limited to RF applications, and may be used in any DC device, including but not limited to Ka-band, MMIC, and power switch devices. For example, embodiments of the present invention may be used in applications with operating frequencies that range from less than about 4 GHz to Ka-Band designs (e.g., 26-40 GHz).

Figure 7:
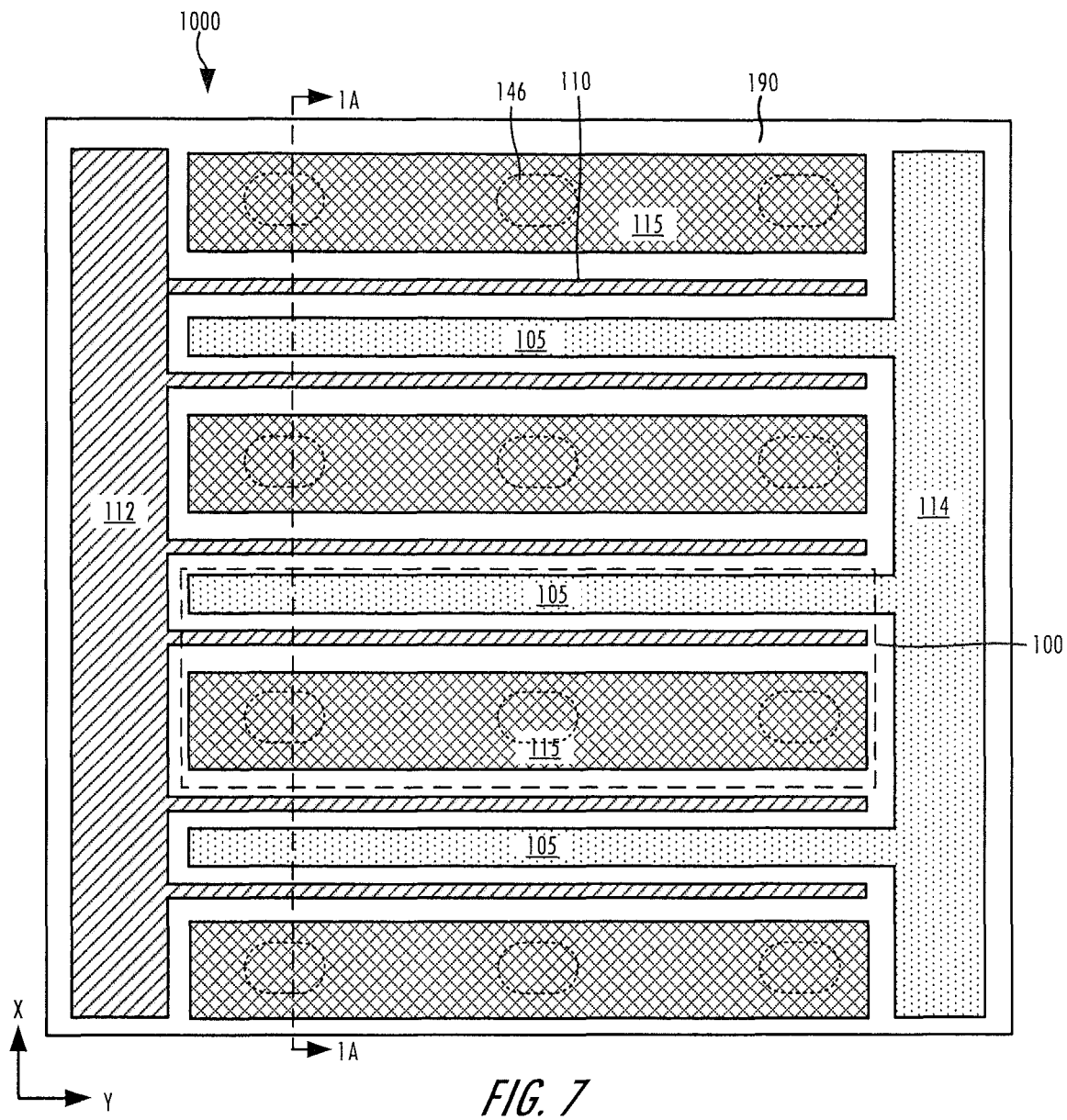
FIG. 7 is a schematic plan view of a Group III nitride-based transistor die according to embodiments of the present invention that illustrates metallization on a surface of the semiconductor layer structure thereof.

In some embodiments, as shown in FIG. 7, a transistor device or die 1000 may include multiple transistor structures 100a, 100b, 100c (collectively 100) connected in parallel to device terminals or electrodes (e.g., an input terminal, an output terminal, and a ground terminal). For example, each of the gate 110, drain 105, and source 115 contacts may extend in a first direction (e.g., the Y-direction) to define gate, drain, and/or source 'fingers', which may be connected by one or more respective buses (e.g., by a gate bus and a drain bus on an upper surface 126A of the semiconductor structure 190. In FIG. 7, the gate fingers 110, drain fingers 105 and source fingers 115 may extend in parallel to each other, with the gate fingers 110 extending from the gate bus 112 in a first direction and the drain fingers 105 extending from the drain bus 114 in a direction opposite the first direction. Each gate finger 110 may be positioned between a drain finger 105 and a source finger 115 to define a unit cell 100. The gate fingers 110, drain fingers 105, and source fingers 315 (and connecting buses) may define part of gate-, drain-, and source-connected electrodes of the device, respectively, as defined by a top or frontside metallization structure. Dielectric layers that isolate the various conductive elements of the frontside metallization structure from each other are not shown in FIG. 7 to simplify the drawing. Since the gate fingers 110 are electrically connected to a common gate bus, the drain fingers 105 are electrically connected to a common drain bus, and the source fingers 115 are electrically connected together (e.g., through respective via openings 146 and a backside metal layer on the back surface 122B of the substrate 122), it can be seen that the unit cell transistors 100 are electrically connected together in parallel.

One of the terminals of the device (e.g., a source terminal connected to the source contact(s) 115) may be configured to be coupled to a reference signal such as, for example, an electrical ground. In some embodiments, a conductive through substrate via connection or structure (e.g., a backside via opening formed through the back surface 122B) may extend through the substrate 122 and epitaxial layer(s) 124, 126 to expose a portion of one of the contacts 105, 115, so as to allow for contact pads or terminals on the back side 122B of the substrate (e.g., to couple the source contact 115 to ground). In other embodiments, a ground connection to one of the terminals device (e.g., the source terminal) may be provided outside the active area, e.g., in a peripheral area. In some embodiments, a backmetal layer on the back side 122B of the substrate 122 may provide a backside ground plane, for example, in applications where proximity to ground may be desired.

While embodiments of the present invention have been described herein with reference to particular HEMT structures, the present invention should not be construed as limited to such structures, and may be applied to formation of many different transistor structures, such as pHEMTs (including GaAs/AlGaAs pHEMTs) and/or GaN MESFETs.

Also, additional layers may be included in transistor structures while still benefiting from the teachings of the present invention. Such additional layers may include GaN cap layers, as described for example U.S. Pat. No. 6,548,333 to Smith. In some embodiments, insulating layers such as $SiN_x$, or relatively high quality AlN may be deposited for making a MISHEMT and/or passivating the surface. The additional layers may also include a compositionally graded transition layer or layers. In addition, the barrier layer 126 and/or channel layer 124 described above may include multiple layers. Thus, embodiments of the present invention should not be construed as limiting these layers to a single layer but may include, for example, barrier layers having combinations of GaN, AlGaN and/or AlN layers.

Figure 8A:
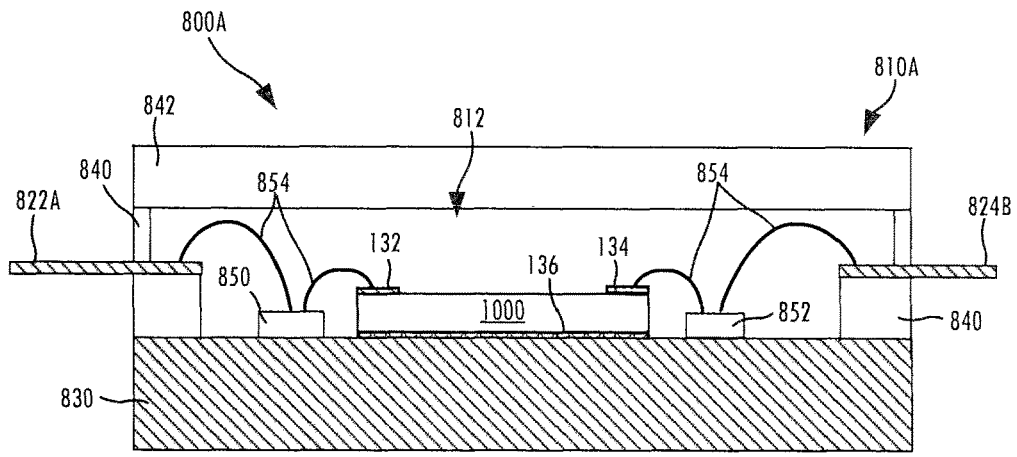
FIGS. 8A, 8B, and 8C are schematic cross-sectional views illustrating several example packages including transistor devices according to embodiments of the present invention to provide packaged transistor amplifiers.
Figure 8B:
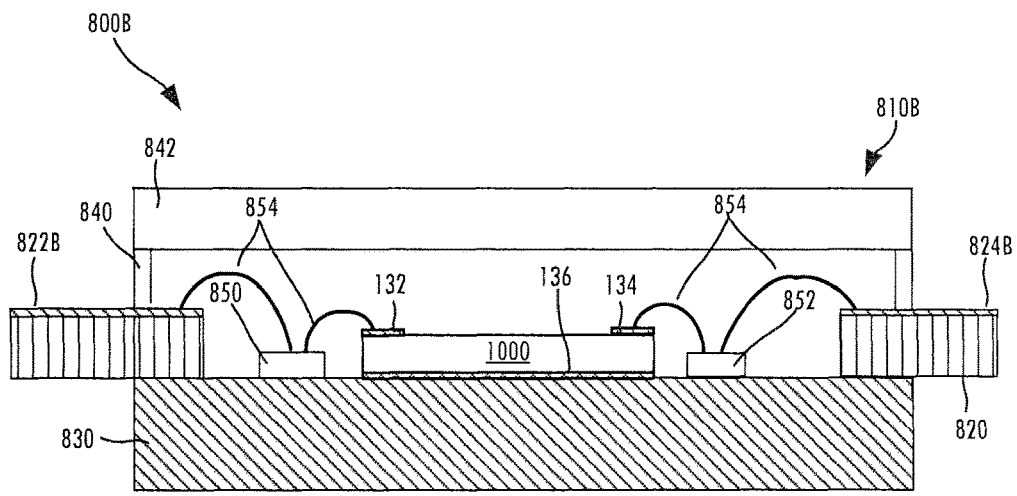
Figure 8C:
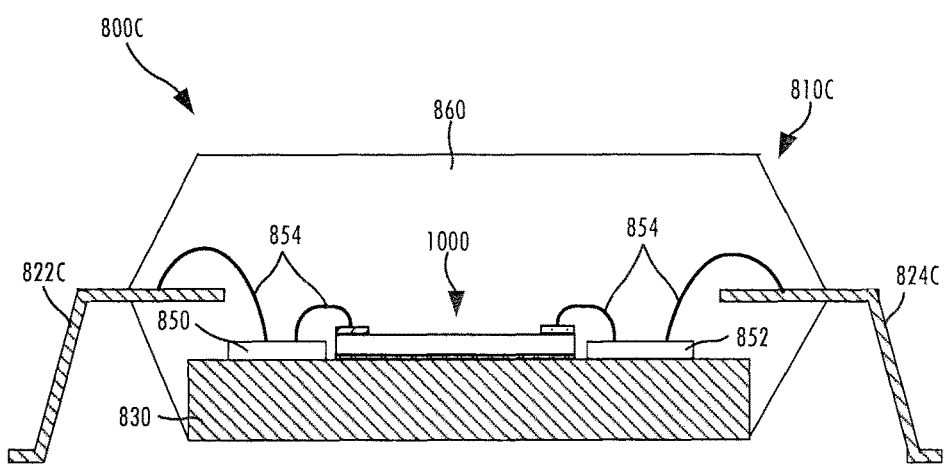

FIGS. 8A, 8B, and 8C are schematic cross-sectional views illustrating several example ways that that the RF transistor amplifier dies according to embodiments of the present invention may be packaged to provide packaged RF transistor amplifiers 800A, 800B, 800C. FIGS. 8A-8C show packaging of the transistor device 1000, which may include any of the transistor structures described herein.

FIG. 8A is a schematic side view of a packaged Group III nitride-based RF transistor amplifier 800A. As shown in FIG. 8A, packaged RF transistor amplifier 800A includes the RF transistor amplifier die 1000 packaged in an open cavity package structure 810A. The package structure 810A includes metal gate leads 822A, metal drain leads 824A, a metal submount 830, sidewalls 840 and a lid 842.

The submount 830 may include materials configured to assist with the thermal management of the package 800A. For example, the submount 830 may include copper and/or molybdenum. In some embodiments, the submount 830 may be composed of multiple layers and/or contain vias/interconnects. In an example embodiment, the submount 830 may be a multilayer copper/molybdenum/copper metal flange that comprises a core molybdenum layer with copper cladding layers on either major surface thereof. In some embodiments, the submount 830 may include a metal heat sink that is part of a lead frame or metal slug. The sidewalls 840 and/or lid 842 may be formed of or include an insulating material in some embodiments. For example, the sidewalls 840 and/or lid 842 may be formed of or include ceramic materials. In some embodiments, the sidewalls 840 and/or lid 842 may be formed of, for example, $Al_2O_3$. The lid 842 may be glued to the sidewalls 840 using an epoxy glue. The sidewalls 840 may be attached to the submount 830 via, for example, brazing. The gate lead 822A and the drain lead 824A may be configured to extend through the sidewalls 842, though embodiments of the present invention are not limited thereto.

The RF transistor amplifier die 1000 is mounted on the upper surface of the metal submount 830 in an air-filled cavity 812 defined by the metal submount 830, the ceramic sidewalls 840 and the ceramic lid 842. Gate and drain terminals 132, 134 of RF transistor amplifier die 1000 are on the top side of the semiconductor structure 190, while the source terminal 136 is on the bottom side of the semiconductor structure 190. The source terminal 136 may be mounted on the metal submount 830 using, for example, a conductive die attach material (not shown). The metal submount 830 may provide the electrical connection to the source terminal 136 and may also serve as a heat dissipation structure that dissipates heat that is generated in the RF transistor amplifier die 1000.

Input matching circuits 850 and/or output matching circuits 852 may also be mounted within the package 800A. The matching circuits 850, 252 may include impedance matching and/or harmonic termination circuits. The impedance matching circuits may be used to match the impedance of the fundamental component of RF signals that are input to or output from the RF transistor amplifier to the impedance at the input or output of the RF transistor amplifier die 1000, respectively. The harmonic termination circuits may be used to ground harmonics of the fundamental RF signal that may be present at the input or output of the RF transistor amplifier die 1000. More than one input matching circuit 850 and/or output matching circuit 852 may be provided. As schematically shown in FIG. 8A, the input and output matching circuits 850, 852 may be mounted on the metal submount 830. The gate lead 822A may be connected to the input matching circuit 850 by one or more bond wires 854, and the input matching circuit 850 may be connected to the gate terminal 132 of RF transistor amplifier die 1000 by one or more additional bond wires 854. Similarly, the drain lead 824A may be connected to the output matching circuit 852 by one or more bond wires 854, and the output matching circuit 852 may be connected to the drain terminal 134 of RF transistor amplifier die 1000 by one or more additional bond wires 854. The bond wires 854, which are inductive elements, may form part of the input and/or output matching circuits.

FIG. 8B is a schematic side view of a packaged Group III nitride-based RF transistor amplifier 800B that includes the transistor device 1000 packaged in a printed circuit board based package structure 810B. The packaged RF transistor amplifier 800B is very similar to the packaged RF transistor amplifier 800A of FIG. 8A, except that the gate and drain leads 822A, 824A of package structure 810A are replaced with printed circuit board based leads 822B, 824B in package structure 810B.

The package structure 810B includes a submount 830, ceramic sidewalls 840, a ceramic lid 842, each of which may be substantially identical to the like numbered elements of package structure 810A discussed above. The package structure 810B further includes a printed circuit board 820. Conductive traces on the printed circuit board 820 form a metal gate lead 822B and a metal drain lead 824B. The printed circuit board 820 may be attached to the submount 830 via, for example, a conductive glue. The printed circuit board 820 includes a central opening and the RF transistor amplifier die 1000 is mounted within this opening on the submount 830. Other components of RF transistor amplifier 800B may be the same as the like-numbered components of RF transistor amplifier 800A, and hence further description thereof will be omitted.

FIG. 8C is a schematic side view of another packaged Group III nitride-based RF transistor amplifier 800C. RF transistor amplifier 800C differs from RF transistor amplifier 800A in that it includes a different package structure 810C. The package structure 810C includes a metal submount 830 (which may be similar or identical to the submount 830 of package structure 810A), as well as metal gate and drain leads 822C, 824C. RF transistor amplifier 800C also includes a plastic overmold 860 that at least partially surrounds the RF transistor amplifier die 1000, the leads 822C, 824C, and the metal submount 830. Other components of RF transistor amplifier 800C may be the same as the like-numbered components of RF transistor amplifier 800A and hence further description thereof will be omitted.

The present invention is described with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense That which is claimed:

1. A transistor device, comprising:
   a semiconductor structure comprising a channel layer and a barrier layer defining a heterojunction therebetween;
   source and drain contacts on the semiconductor structure;
   a gate on the semiconductor structure between the source and drain contacts; and
   a surface passivation layer directly on the barrier layer of the semiconductor structure between the gate and one of the source contact or the drain contact, the surface passivation layer comprising a first opening therein that exposes a first region of the semiconductor structure and a second opening having the gate therein,
   wherein the first region is between the gate and the one of the source contact or the drain contact, is laterally spaced apart from the source and drain contacts, and comprises a greater surface potential and has a higher conductivity than a second region of the semiconductor structure adjacent the gate.

2. The transistor device of claim 1, wherein a first portion of a surface of the barrier layer in the first region comprises the greater surface potential than a second portion of the surface of the barrier layer in the second region having the surface passivation layer directly thereon.

3. The transistor device of claim 2, wherein a first portion of a conduction channel in the first region has lower sheet resistance than a second portion of the conduction channel in the second region.

4. The transistor device of claim 2, wherein the first portion of the surface of the barrier layer in the first region comprises modified interface states, and wherein the second portion of the surface of the barrier layer in the second region is free of the modified interface states or comprises differently modified interface states.

5. The transistor device of claim 4, wherein the surface passivation layer is a first passivation layer that is directly on the barrier layer, and further comprising:
   a second passivation layer on the first passivation layer and extending into the first opening to contact the first portion of the surface of the barrier layer in the first region,
   wherein an interface between the first portion of the surface of the barrier layer in the first region and the second passivation layer comprises the modified interface states, which are different than an interface between the portion of the surface of the barrier layer in the second region and the first passivation layer directly thereon.

6. The transistor device of claim 5, wherein the modified interface states are defined by formation of the second passivation layer.

7. The transistor device of claim 5, further comprising:
   a field plate on the second passivation layer and between the gate and the drain contact, wherein the first opening is laterally spaced apart from at least a portion of the field plate.

8. The transistor device of claim 7, wherein the field plate at least partially overlaps with the first opening with the second passivation layer therebetween.

9. The transistor device of claim 4, wherein the first region is defined by ion bombardment, plasma nitridation, plasma oxidation, hydrogen plasma treatment, and/or annealing in a gas environment.

10. The transistor device of claim 2, wherein the first opening is laterally separated from the gate by the second region.

11. The transistor device of claim 10, wherein the gate comprises a sidelobe portion laterally extending along the surface passivation layer toward the source or drain contact, wherein the sidelobe portion extends over the second region.

12. The transistor device of claim 11, wherein the first opening is laterally spaced apart from the gate along a surface of the semiconductor structure by a spacing that is greater than or equal to a length of lateral extension of the sidelobe portion, wherein the spacing is about 10 nanometers (nm) to about 500 nm.

13. The transistor device of claim 1, wherein the first region is a source access region that is between the gate and the source contact, or is a drain access region that is between the gate and the drain contact.

14. The transistor device of claim 1, wherein the first region is free of overlap with the source and drain contacts in a direction perpendicular to a surface of the semiconductor structure having the surface passivation layer thereon.

15. The transistor device of claim 1, wherein the surface passivation layer is a first passivation layer directly on the barrier layer and having the first and second openings therein, wherein a first interface between the first passivation layer and the barrier layer has a first surface potential, and further comprising:
   a second passivation layer on the first passivation layer and extending into the first opening to directly contact the first region, wherein a second interface between the second passivation layer and the first region of the semiconductor structure has a second surface potential that is greater than the first surface potential.

16. The transistor device of claim 15, wherein the first passivation layer has a first thickness that is configured to reduce a capacitance between the gate and the drain contact.

17. A transistor device, comprising:
   a semiconductor structure comprising a channel layer and a barrier layer defining a heterojunction therebetween;
   source and drain contacts on the semiconductor structure;
   a gate on the semiconductor structure between the source and drain contacts; and
   a surface passivation layer directly on the barrier layer of the semiconductor structure between the gate and one of the source contact or the drain contact,
   wherein the semiconductor structure comprises a first region that is exposed by a first opening in the surface passivation layer between the gate and one of the source contact or the drain contact and laterally spaced apart from the source and drain contacts, and a second region adjacent a second opening in the surface passivation layer having the gate therein, wherein the first region comprises a greater surface potential and has lower sheet resistance than the second region.

18. The transistor device of claim 17, wherein the semiconductor structure comprising the first and second regions has a conductivity that varies in a non-uniform manner between the gate and the source or drain contact, and wherein the first region includes a local maximum of the conductivity.

19. The transistor device of claim 18, wherein a first portion of a surface of the barrier layer in the first region comprises modified interface states, and wherein a second portion of the surface of the barrier layer in the second region is free of the modified interface states or comprises differently modified interface states.

20. The transistor device of claim 17,
wherein the gate comprises a sidelobe portion laterally extending along the surface passivation layer toward the source or drain contact, and
wherein the first opening is laterally separated from the gate by the second region and by a spacing that is greater than or equal to a length of lateral extension of the sidelobe portion, wherein the spacing is about 10 nanometers (nm) to about 500 nm.

21. A transistor device, comprising:
a semiconductor structure comprising a channel layer and a barrier layer defining a heterojunction therebetween;
source and drain contacts on the semiconductor structure;
a gate directly on a surface of the semiconductor structure between the source and drain contacts; and
one or more passivation layers directly on the barrier layer of the semiconductor structure between the gate and one of the source contact or the drain contact, the one or more passivation layers comprising a first nitride-based layer and a second nitride-based layer that is stacked on the first nitride-based layer,
wherein a conductivity of the semiconductor structure varies in a non-uniform manner in a direction along an interface with the one or more passivation layers thereon, and wherein a local maximum of the conductivity is provided between the gate and the one of the source contact or the drain contact and laterally spaced apart from the source and drain contacts.

22. The transistor device of claim 21, wherein the semiconductor structure comprises a first region between the gate and the source or drain contact, and a second region adjacent the gate, wherein the first region has a higher conductivity than the second region.

23. The transistor device of claim 22, wherein the first region comprises a greater surface potential than the second region.

24. The transistor device of claim 22, wherein the first region comprises modified interface states, and wherein the second region is free of the modified interface states or comprises differently modified interface states.

25. The transistor device of claim 24, wherein the first nitride-based layer is on the second region of the semiconductor structure adjacent the gate and comprises a first opening therein that exposes the first region and a second opening having the gate therein,
wherein the gate comprises a sidelobe portion laterally extending along the surface of the first nitride-based layer toward the source or drain contact, and
wherein the first opening is laterally separated from the gate by the second region and by a spacing that is greater than or equal to a length of lateral extension of the sidelobe portion, wherein the spacing is about 10 nanometers (nm) to about 500 nm.

26. A method of fabricating a transistor device, the method comprising:
forming a surface passivation layer directly on the barrier layer of a semiconductor structure;
forming source and drain contacts and a gate on the semiconductor structure;
forming a first opening and a second opening in the surface passivation layer, wherein the first opening exposes a first region of the semiconductor structure;
forming a gate in the second opening, wherein the first opening is between the gate and one of the source contact or the drain contact; and
processing the first region of the semiconductor structure that is exposed by the first opening differently than a second region of the semiconductor structure that is adjacent the gate,
wherein the first region is laterally spaced apart from the source and drain contacts, and comprises a greater surface potential and has a higher conductivity than the second region of the semiconductor structure responsive to the processing.

27. The method of claim 26, wherein the semiconductor structure comprises a channel layer defining a heterojunction with the barrier layer.

28. The method of claim 27, wherein the processing comprises performing a surface treatment of the first region exposed by the first opening to modify interface states thereof, and wherein the second region is substantially unaffected by the surface treatment.

29. The method of claim 28, wherein the surface treatment comprises ion bombardment, plasma nitridation, plasma oxidation, hydrogen plasma treatment, and/or annealing in a gas environment.

30. The method of claim 28, wherein the surface treatment comprises wet etching in an acidic chemical solution, wet etching in a basic chemical solution, and/or treatment in a neutral chemical solution.

31. The method of claim 28, wherein the surface passivation layer is a first passivation layer that is directly on the barrier layer, and further comprising:
forming a second passivation layer on the first passivation layer and extending into the first opening to contact the first region,
wherein an interface between the first region and the second passivation layer comprises the modified interface states, which are different than an interface between the second region and the first passivation layer.

32. The method of claim 31, wherein forming the second passivation layer preserves the modified interface states of the first region.

33. The method of claim 27, wherein the surface passivation layer is a first passivation layer, and further comprising:
forming a second passivation layer on the first passivation layer and extending into the first opening to contact the first region,
wherein forming the second passivation layer modifies interface states of the first region.

34. The method of claim 27, wherein forming the first opening in the surface passivation layer modifies interface states of the first region.

* * * * *

UNITED STATES PATENT AND TRADEMARK OFFICE
CERTIFICATE OF CORRECTION

| | |
|---|---|
| PATENT NO. | : 12,446,252 B2 |
| APPLICATION NO. | : 17/325488 |
| DATED | : October 14, 2025 |
| INVENTOR(S) | : Bisges et al. |

It is certified that error appears in the above-identified patent and that said Letters Patent is hereby corrected as shown below:

In the Specification

Column 16, Line 16: Please correct "Los." to read --$L_{GS}$.--

Signed and Sealed this
Tenth Day of February, 2026

John A. Squires
*Director of the United States Patent and Trademark Office*